US008853818B2

(12) United States Patent
Lue

(10) Patent No.: US 8,853,818 B2
(45) Date of Patent: Oct. 7, 2014

(54) 3D NAND FLASH MEMORY

(71) Applicant: Hang-Ting Lue, Zhubei (TW)

(72) Inventor: Hang-Ting Lue, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/772,058

(22) Filed: Feb. 20, 2013

(65) Prior Publication Data
US 2014/0231954 A1 Aug. 21, 2014

(51) Int. Cl.
H01L 23/52 (2006.01)
H01L 21/82 (2006.01)

(52) U.S. Cl.
USPC .......................................... 257/530; 438/131

(58) Field of Classification Search
USPC ................... 438/216, 266, 131, 467; 365/63, 365/185.18; 257/529–531, 257/E21.21–E21.394
See application file for complete search history.

(56) References Cited

U.S. PATENT DOCUMENTS

| 8,163,616 B2 * | 4/2012 | Kang et al. ................. 438/258 |
| 8,208,279 B2 * | 6/2012 | Lue ............................ 365/63 |
| 8,363,476 B2 | 1/2013 | Lue et al. |
| 2009/0184360 A1 | 7/2009 | Jin et al. |
| 2012/0182808 A1 | 7/2012 | Lue et al. |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.
Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

* cited by examiner

*Primary Examiner* — Calvin Lee
(74) *Attorney, Agent, or Firm* — Yiding Wu; Haynes Beffel & Wolfeld LLP

(57) ABSTRACT

A memory device includes an array of NAND strings of memory cells. The device includes a plurality of stacks of conductive strips separated by insulating material, including at least a bottom plane of conductive strips, a plurality of intermediate planes of conductive strips, and a top plane of conductive strips. The device includes charge storage structures in interface regions at cross-points between side surfaces of the conductive strips in the plurality of intermediate planes in the stacks and inter-stack semiconductor body elements of a plurality of bit line structures. At least one reference line structure is arranged orthogonally over the stacks, including vertical conductive elements between the stacks in electrical communication with a reference conductor between the bottom plane of conductive strips and a substrate, and linking elements over the stacks connecting the vertical conductive elements. The vertical conductive elements have a higher conductivity than the semiconductor body elements.

17 Claims, 33 Drawing Sheets

＃ 3D NAND FLASH MEMORY

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n− polysilicon cathode connected to a bit line, with the anode and cathode separated by anti-fuse material.

In the processes described in Lai, et al., Jung, et al. and Johnson, et al., there are several critical lithography steps for each memory layer. Thus, the number of critical lithography steps needed to manufacture the device is multiplied by the number of layers that are implemented. So, although the benefits of higher density are achieved using three-dimensional (3D) arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory," 2007 Symposium on VLSI Technology Digest of Technical Papers, 12-14 Jun. 2007, pages 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

It is desirable to provide a structure for three-dimensional integrated circuit memory with a low manufacturing cost, including reliable, very small memory elements.

SUMMARY OF THE INVENTION

A memory device includes an array of NAND strings of memory cells. The device includes an integrated circuit substrate, and a plurality of stacks of conductive strips separated by insulating material, including at least a bottom plane of conductive strips, a plurality of intermediate planes of conductive strips, and a top plane of conductive strips.

A plurality of bit line structures are arranged orthogonally over, and have surfaces conformal with, the plurality of stacks, including inter-stack semiconductor body elements between the stacks and linking elements over the stacks connecting the inter-stack semiconductor body elements. The memory device includes string select switches at interface regions with the top plane of conductive strips, and reference select switches at interface regions with the bottom plane of conductive strips.

The memory device includes charge storage structures in interface regions at cross-points between side surfaces of the conductive strips in the plurality of intermediate planes in the stacks and the inter-stack semiconductor body elements of the plurality of bit line structures.

In one aspect of the technology described herein, a reference conductor is disposed between the bottom plane of conductive strips and the substrate. At least one reference line structure is arranged orthogonally over the plurality of stacks, including inter-stack vertical conductive elements between the stacks in electrical communication with the reference conductor. The at least one reference line structure also includes linking elements over the stacks connecting the inter-stack vertical conductive elements. The inter-stack vertical conductive elements can have a higher conductivity than the inter-stack semiconductor body elements.

In another aspect of the technology described herein, at least some of the conductive strips in the plurality of stacks comprise a silicon body with a silicide layer on a side of the silicon body opposite the side surfaces on which the charge storage structures are disposed.

Methods for manufacturing memory devices as described herein are also provided.

Other aspects and advantages of the present invention can be seen on review of the drawings, the detailed description and the claims, which follow.

DETAILED DESCRIPTION

A detailed description of embodiments of the present invention is provided with reference to the FIGS. 1-33.

Figure 1:
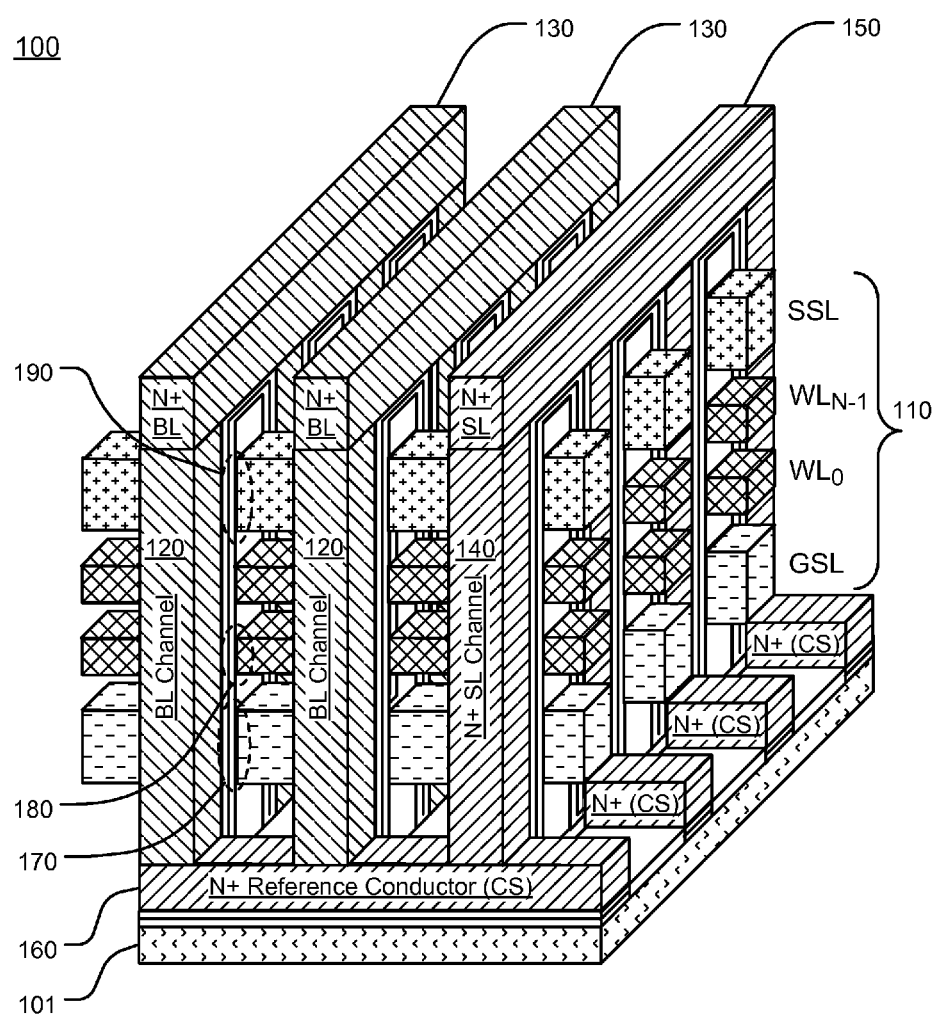
FIG. 1 is a schematic diagram of a 3D memory device.

FIG. 1 is a schematic diagram of a three-dimensional (3D) memory device 100. The memory device 100 includes an array of NAND strings of memory cells, and can be a double-gate vertical channel memory array (DGVC). The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 110 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on.

The plurality of bit line structures are arranged orthogonally over, and have surfaces conformal with, the plurality of stacks, including inter-stack semiconductor body elements 120 between the stacks and linking elements 130 over the stacks connecting the inter-stack semiconductor body elements 120. The linking elements 130 in this example comprise a semiconductor, such as polysilicon, having a relatively high doping concentration so that they have higher conductivity than the inter-stack semiconductor body elements 120, which are configured to provide channel regions for the cells in the stacks.

The memory device includes charge storage structures in interface regions at cross-points 180 between side surfaces of the conductive strips in the plurality of intermediate planes (WLs) in the stacks and the inter-stack semiconductor body elements 120 of the plurality of bit line structures. In the illustrated example, the memory cells in the cross-points 180 are configured in vertical, dual-gate NAND strings, where the conductive strips on both sides of a single inter-stack semiconductor body element behave as dual-gates, and can be operated cooperatively for read, erase and program operations.

A reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking elements 150 over the stacks 110 connecting the inter-stack vertical conductive elements 140. The inter-stack vertical conductive elements 140 can have a higher conductivity than the inter-stack semiconductor body elements 120.

The memory device includes string select switches 190 at interface regions with the top plane of conductive strips, and reference select switches 170 at interface regions with the bottom plane (GSL) of conductive strips. The dielectric layers of the charge storage structure can act as gate dielectric layers for the switches 170, 190 in some examples.

The memory device includes a first overlying patterned conductive layer (not shown) connected to the plurality of bit line structures, including a plurality of global bit lines coupled to sensing circuits. The memory device also includes a second overlying conductive layer (not shown), which can be patterned, and can be above or below the first patterned conductor layer. The second overlying conductive layer is connected to the at least one reference line structure, such as by contact to the linking element 150. The second patterned conductor layer can connect the at least one reference line structure to a reference voltage source, or to circuitry for providing a reference voltage.

In the example shown in FIG. 1, the linking elements 130 of the bit line structures include N+ doped semiconductor material. The inter-stack semiconductor body elements 120 of the bit line structures include lightly doped semiconductor material. In the example shown in FIG. 1, the reference conductor 160 includes N+ doped semiconductor material, and the linking elements 150 of the at least one reference line structure include N+ doped semiconductor material. The inter-stack vertical conductive elements 140 of the at least one reference line structure also include N+ doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 2:
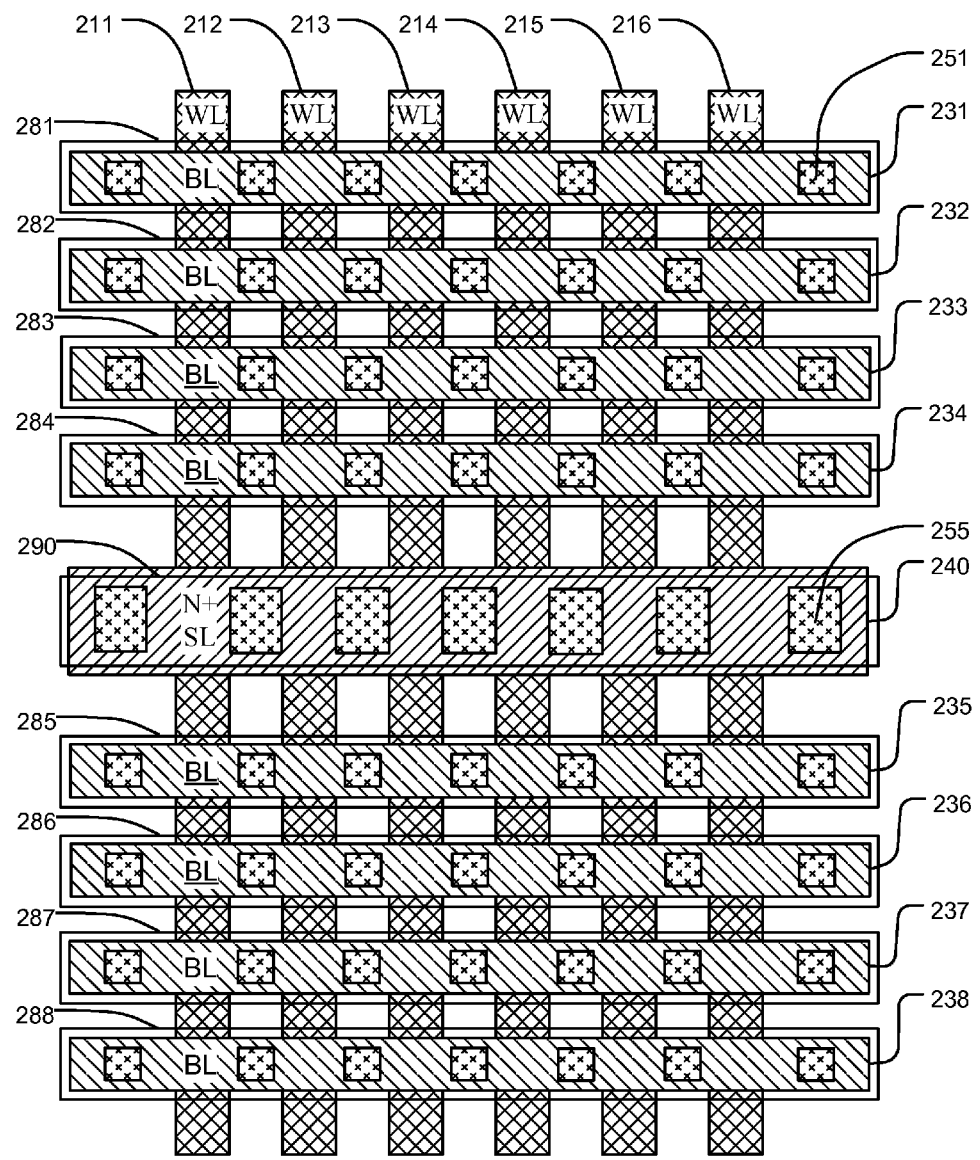
FIG. 2 is a layout schematic corresponding to a top view of the 3D schematic diagram in FIG. 1.

FIG. 2 is a layout schematic corresponding to a top view of the 3D schematic diagram in FIG. 1. Bit lines 231 through 234, and bit lines 235 through 238 correspond to the linking elements 130 in the plurality of bit line structures (FIG. 1). Source line 240 corresponds to the linking element 150 in the at least one reference line structure (FIG. 1); other source lines can be disposed at intervals along the array. The bit lines (BL) and the source line (SL) are arranged orthogonally over word lines (WL) 211 through 216, which word lines are in the plurality of intermediate planes of conductive strips. Although only four bit lines are shown at each side of the source line 240, there can be any number of bit lines on each side of the source line 240. For instance, there can be eight or sixteen bit lines at each side of the source line 240.

In the example shown in FIG. 2, the memory device includes a first overlying layer, which includes first overlying lines 281-288. The first overlying conductive layer can include metal, doped semiconductor or combinations of materials. The first overlying lines 281-288 are directly connected to the bit lines 231 through 238 via bit line contacts 251 to minimize bit line loading resistance. As described herein, bit lines 231 through 238 correspond to the linking elements 130 in the plurality of bit line structures (FIG. 1), thus the first overlying conductive layer is connected to the plurality of bit line structures. The first overlying conductive layer can include a plurality of global bit lines coupled to sensing circuits (not shown). Locations of bit line contacts 251 are representative of one example. The physical layout of bit line contacts can be periodic or aperiodic, where more regular layouts can provide for better lithography exposure.

In the example shown in FIG. 2, the memory device includes a second overlying layer 290. The second overlying conductive layer can include metal, doped semiconductor or combinations of materials. The second overlying layer 290 is directly connected to the source line 240 via source line contacts 255 to minimize source line loading resistance. As described herein, the source line 240 corresponds to the linking element 150 in the at least one reference line structure (FIG. 1), thus the second overlying conductive layer is connected to the at least one reference line structure. The second overlying conductive layer can be coupled to a reference voltage source (not shown). Locations of source line contacts 255 are representative of one example. The physical layout of source line contacts can be periodic or aperiodic, where more regular layouts can provide for better lithography exposure.

The inter-stack vertical conductive elements 140 (FIG. 1) in the at least one reference line structure can have a larger cross-sectional area than the inter-stack semiconductor body elements 120 (FIG. 1) in the bit line structures. Correspondingly, source line contacts 255 can have a larger cross-sectional area than bit line contacts 251.

Figure 3:
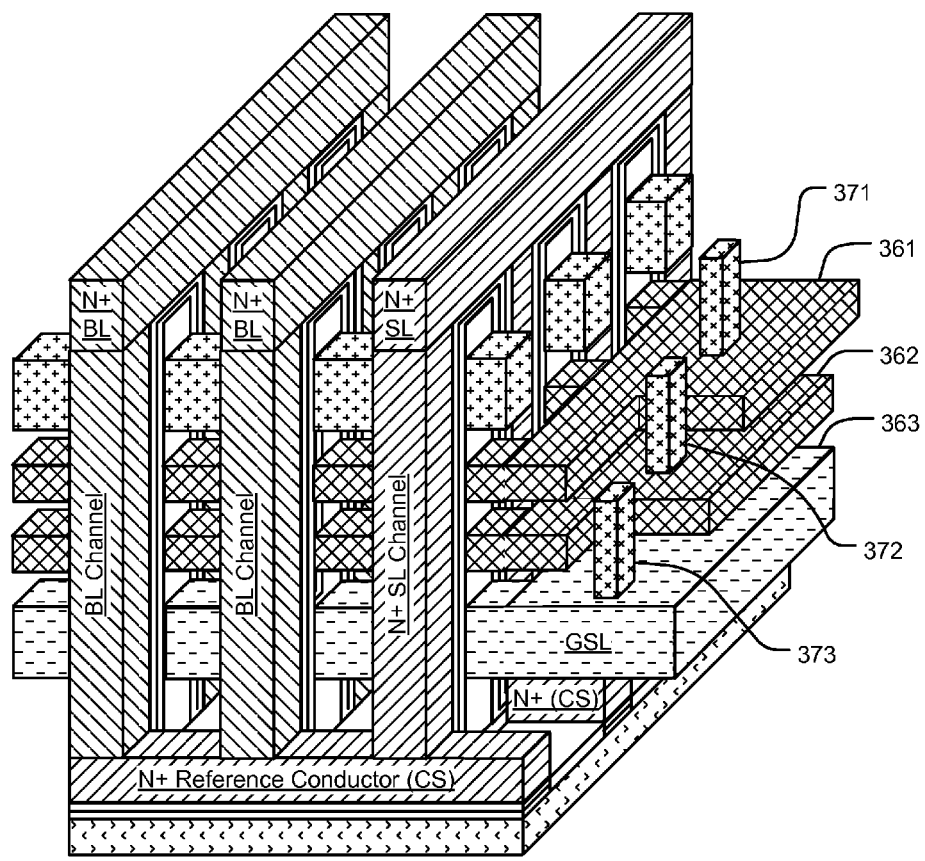
FIG. 3 is a schematic diagram of a 3D memory device including decoding structures.

FIG. 3 is a schematic diagram of a 3D memory device including an illustration of pad areas in the conductive strips for the horizontal word line and GSL line structures, configured for staircase contacts to overlying decoding circuits. String selection lines in the top plane of conductive strips are independently coupled to and controlled by the string selection line decoding circuits.

Conductive strips in the intermediate planes (WLs), and conductive strips in the bottom plane (GSL) are connected together to reduce decoder areas and consequently the overall size of the memory device. Conductive strips in the top plane (SSL) are individually decoded to allow correct bit line decoding.

The memory device can include linking elements, such as linking elements 361 and 362, that provide pad areas connecting sets of word lines in the intermediate planes (WL), and interlayer connectors, such as interlayer connectors 371 and 372, coupled to landing areas in the linking elements 361 and 362, where the linking elements include openings through which interlayer connectors coupled to landing areas in lower intermediate planes extend. The landing areas are at interface regions between bottom surfaces of the interlayer connectors and top surfaces of the linking elements.

As illustrated in FIG. 3, interlayer connectors for sets of word lines at multiple layers in the plurality of intermediate planes are arranged in a staircase structure. Accordingly, interlayer connectors 371 and 372 are connected to landing areas at two different layers in the plurality of intermediate planes. The staircase structure can be formed in a word line decoder region near the boundary of a region for the array of NAND strings of memory cells and a region for peripheral circuits.

In the example shown in FIG. 3, the memory device includes linking elements, such as a linking element 363, connecting sets of ground selection lines in the bottom plane (GSL) of conductive strips, and interlayer connectors, such as an interlayer connector 373, coupled to landing areas in the linking elements in the bottom plane, where the interlayer connectors extend through the openings in the linking elements in the intermediate planes (WLs). The landing areas are at interface regions between bottom surfaces of the interlayer connectors, such as an interlayer connector 373, and top surfaces of the linking elements, such as a linking element 363.

Figure 4:
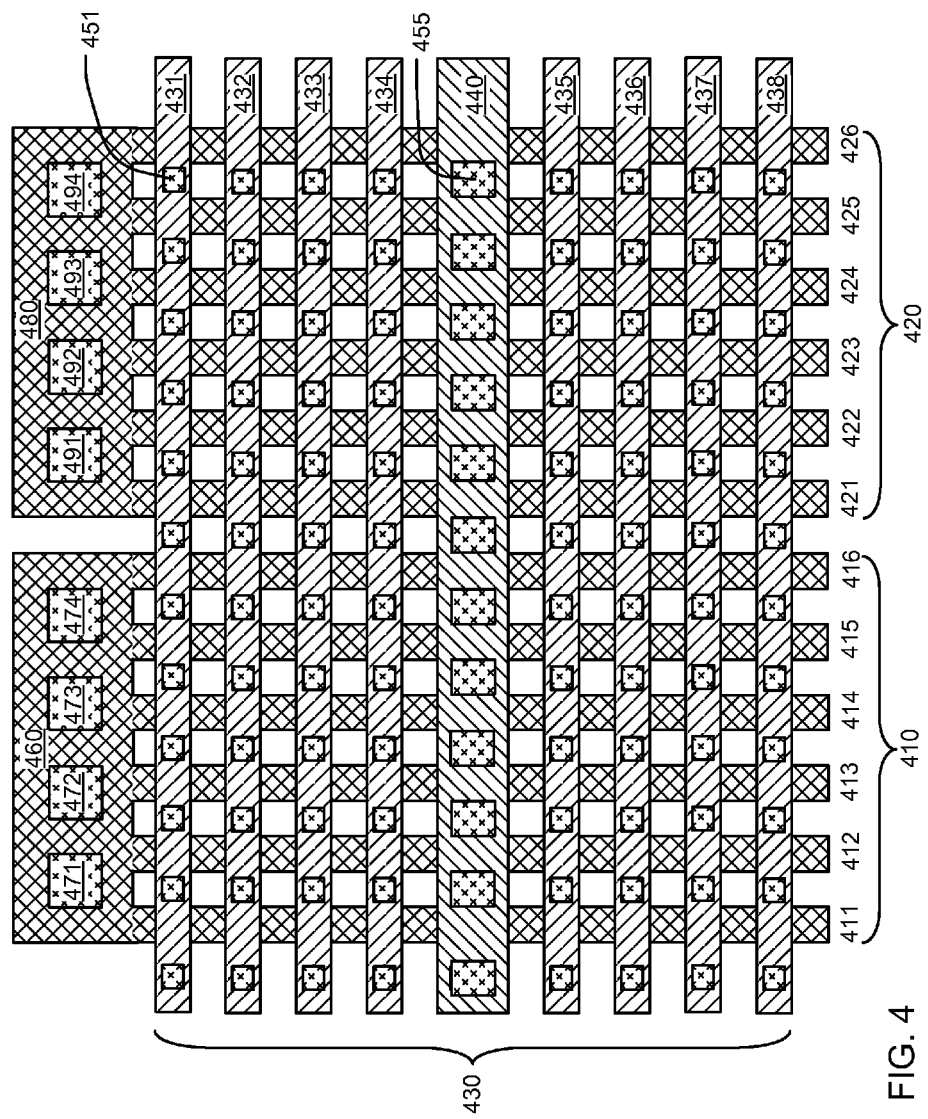
FIG. 4 is a layout schematic corresponding to a top view of the 3D schematic diagram in FIG. 3.

FIG. 4 is a layout schematic corresponding to a top view of the 3D schematic diagram in FIG. 3. In the example shown in FIG. 4, a group 430 of linking elements 431 through 438 in the bit line structures and at least a linking element 440 in the at least one reference line structure are arranged orthogonally over a first set 410 of word lines in the intermediate planes (WL), and a second adjacent set 420 of word lines in the intermediate planes (WL). The linking elements 431 through 438 in the bit line structures act as bit lines. The linking element 440 in the at least one reference line structure acts as a source line. In the example shown in FIG. 4, bit line contacts 451 directly connect the linking elements 431 through 438 in the bit line structures to the first overlying lines (e.g. 281-288, FIG. 2). Source line contacts 455 directly connect the linking element 440 in the at least one reference line structure to the second overlying layer (e.g. 290, FIG. 2). Locations of bit line contacts and source line contacts are for illustration of one example. Actual physical layouts of bit line contacts and source line contacts relative to word lines can be periodic or aperiodic, where more regular layouts can provide for better lithography exposure.

The group 430 includes a first set 410 of word lines 411 through 416 in the intermediate planes (WL), and a second adjacent set 420 of word lines 421 through 426 in the intermediate planes (WL). The members of the first set 410 are coupled together by a linking element, providing a pad on which respective ones of the interlayer connectors 471-474 contact landing areas. Likewise, the members of the second set 420 are coupled together by a linking element, providing a pad on which respective ones of the interlayer connectors 491-494 contact landing areas.

Interlayer connectors 471 through 474 for the first set 410 are arranged on a side of the group 430 parallel to the bit lines in the group 430. Interlayer connectors 491 through 494 for the second set 420 are arranged on the same side of the group 430. String selection lines in the top plane of conductive strips corresponding to the first set 410 and the second set 420 are coupled to the string selection line decoding circuits (not shown) from a side of the group 430 opposite to the side of the interlayer connectors.

Linking elements 460 connect word lines in the first set 410 in a single patterned word line structure for a level of the block of memory cells. Interlayer connectors 471 through 474 are coupled to landing areas in the linking elements 460, and to the word line decoding circuits (not shown). Similarly, linking element 480 connects word lines in the second set 420. Interlayer connectors 491 though 494 are coupled to landing areas in the linking element 480, and to the word line decoding circuits. The landing areas are at interface regions between bottom surfaces of the interlayer connectors and top surfaces of the linking elements.

As described herein for FIG. 3, interlayer connectors for sets of word lines at multiple layers in the plurality of intermediate planes are arranged to contact the pads (e.g. linking elements 460, 480) in a staircase structure. Accordingly, interlayer connectors 471 through 474 can be connected to landing areas at four different layers in the plurality of intermediate planes, and interlayer connectors 491 through 494 can be connected to landing areas at the same, or at different ones of the, four different layers in the plurality of intermediate planes.

Although, as illustrated in FIG. 4, the first set 410 and the second set 420 include 6 word lines each, more word lines can be in each set. For instance, each of the first set 410 and the second set 420 can include 8, 16, or 32 word lines. Similarly, although only 4 bit lines are shown at each side of the linking element 440 in the at least one reference line structure, there can be more bit lines on each side of the linking element 440. For instance, there can be 8 or 16 bit lines on each side of the linking element 440.

The circuit layout shown in FIG. 4 can be repeated in the horizontal and vertical directions.

Figure 5:
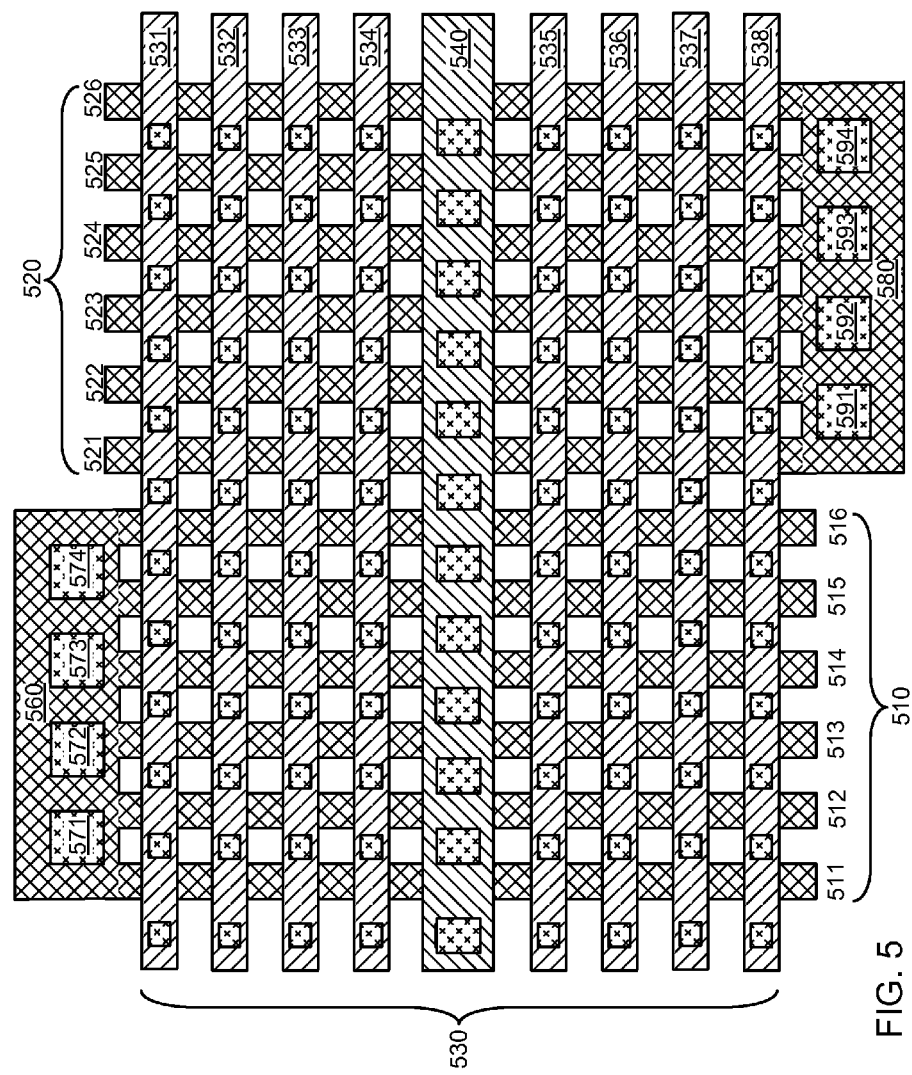
FIG. 5 is an alternative layout schematic to the layout schematic shown in FIG. 4.

FIG. 5 is an alternative layout schematic. The description for FIG. 4 is generally applicable to FIG. 5. In the example shown in FIG. 5, a group 530 of linking elements 531 through 538 in the bit line structures and at least a linking element 540 in the at least one reference line structure are arranged orthogonally over a first set 510 of word lines 511 through 516 in the intermediate planes (WL), and a second adjacent set 520 of word lines 521 through 526 in the intermediate planes (WL). The linking elements 531 through 538 in the bit line structures act as bit lines. The linking element 540 in the at least one reference line structure acts as a source line.

Interlayer connectors 571 through 574 for the first set 510 are arranged on one side of the group 530 in the linking element 560. Interlayer connectors 591 through 594 for the second set 520 are arranged on another, opposing side of the group 530 in the linking element 580.

String selection lines in the top plane of conductive strips corresponding to the first set 510 are coupled to the string selection line decoding circuits from the same side of the group 530 as the side of the interlayer connectors for the second set 520 of word lines. String selection lines in the top plane of conductive strips corresponding to the second set 520 of word lines are coupled to the string selection line decoding circuits from the same side of the group 530 as the side of the interlayer connectors for the first set 510 of word lines.

The alternative layout illustrated in FIG. 5 provides a larger process window for the word line decoding circuits and string selection line decoding circuits, and can be repeated in mirror image in the word line direction, whereby the linking elements can be shared among groups, with contacts to the linking elements being made in every other set, and being arranged in an offset fashion as shown for adjacent word line structures.

Figure 6:
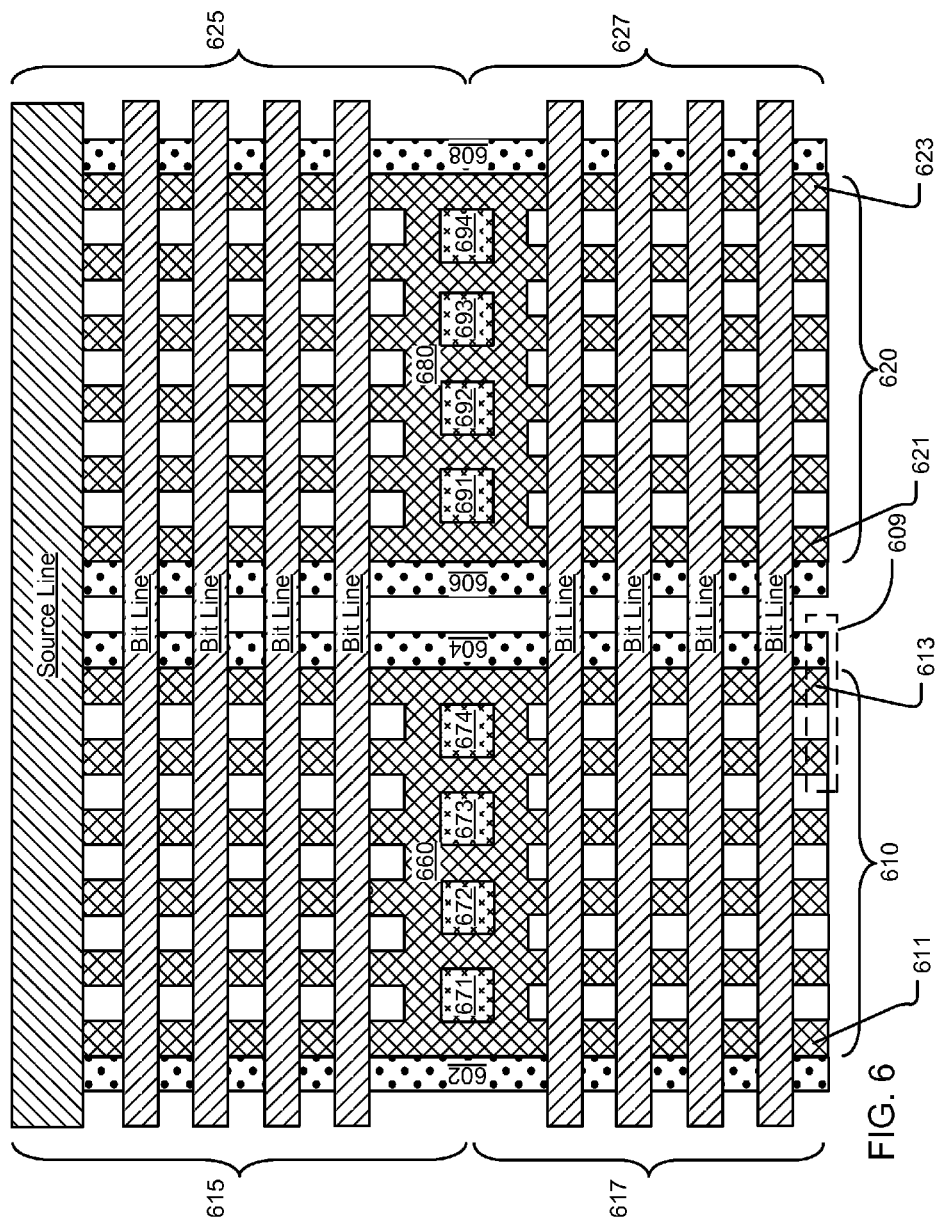
FIG. 6 is a layout schematic illustrating a sidewall word line silicide formation.

FIG. 6 is a layout schematic illustrating a sidewall word line silicide formation. Sidewall word line silicide formations can reduce resistance of the word line structures, and consequently word line RC delay across a large array. The memory device can include blocks that include linking elements connecting sets of word lines in the intermediate planes (WLs), and interlayer connectors coupled to landing areas in the linking elements, where ends of the word lines in adjacent blocks are connected via the linking elements, and the linking elements include openings through which interlayer connecters coupled to landing areas in lower intermediate planes extend. The memory device can further include sidewall silicide formations disposed on at least one side of adjacent blocks parallel to word lines in the adjacent blocks.

In the example shown in FIG. 6, the memory device includes adjacent blocks 615 and 617 that include a linking element 660 connecting a set of word lines 610 in the intermediate planes (WLs), and interlayer connectors 671 through 674 coupled to landing areas in the linking element 660. Ends of the word lines in adjacent blocks 615 and 617 are connected via the linking element 660.

The memory device also includes adjacent blocks 625 and 627 that include a linking element 680 connecting a set of word lines 620 in the intermediate planes (WLs), and interlayer connectors 691 through 694 coupled to landing areas in the linking element 680. Ends of the word lines in adjacent blocks 625 and 627 are connected via the linking element 680.

The linking elements include openings through which interlayer connecters coupled to landing areas in lower intermediate planes extend. In the example shown in FIG. 3, linking elements 361 and 362 include openings through which interlayer connecters 372 and 373 coupled to landing areas in lower intermediate planes extend, respectively.

The word line structure that includes linking element 660 in this embodiment includes sidewall silicide formations 602 and 604 disposed on the side of the outermost conductive strips 611 and 613. Also, the word line structure that includes linking element 680 in this embodiment includes sidewall silicide formations 606 and 608 disposed on the side of the outermost conductive strips 621 and 623. The silicide formations can improve the conductivity of the word line structures for distribution of word line voltages in a large array.

Figure 7:
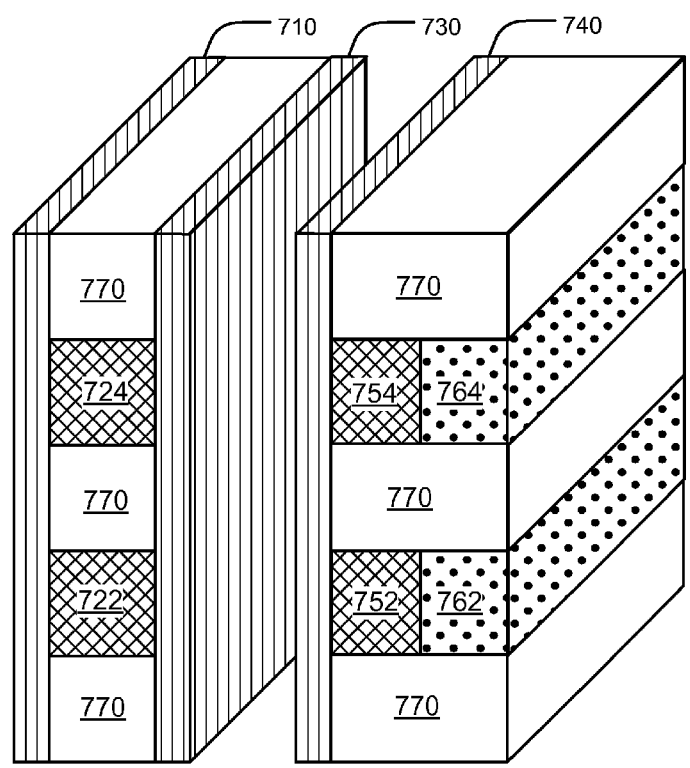
FIG. 7 is a 3D schematic diagram illustrating a sidewall word line silicide formation in a double-gate vertical channel structure.

Area 609 in FIG. 6 can be understood in more detail with reference to a 3D schematic diagram in FIG. 7.

FIG. 7 is a 3D schematic diagram illustrating a sidewall word line silicide formation in a double-gate vertical channel structure, corresponding to the area 609 in FIG. 6. Two layers of word lines are illustrated. A first layer of the two layers includes a word line 722 and a word line 752. A second layer of the two layers includes a word line 724 and a word line 754. The four word lines are in the set of word lines (e.g., 610 FIG. 6). Word lines 722 and 724 are inside the set of word lines 610. Word lines 752 and 754 correspond to the outermost conductive strips 611, 613 of FIG. 6, and have sidewall silicide formations 762 and 764, respectively, on their sidewalls on a side of the set of word lines 610.

In the example shown in FIG. 7, dielectric charge storage layers 710 and 730, such as ONO (oxide-nitride-oxide) materials, are formed on opposing sidewalls of the word line 722 and word line 724 for forming charge storage structures. Dielectric charge storage layers 740 can be formed on a sidewall of the word line 752 and word line 754 opposite a sidewall of the word lines with sidewall silicide formations. Word lines are separated by insulating oxide materials 770 from other word lines above or below.

Figure 33:
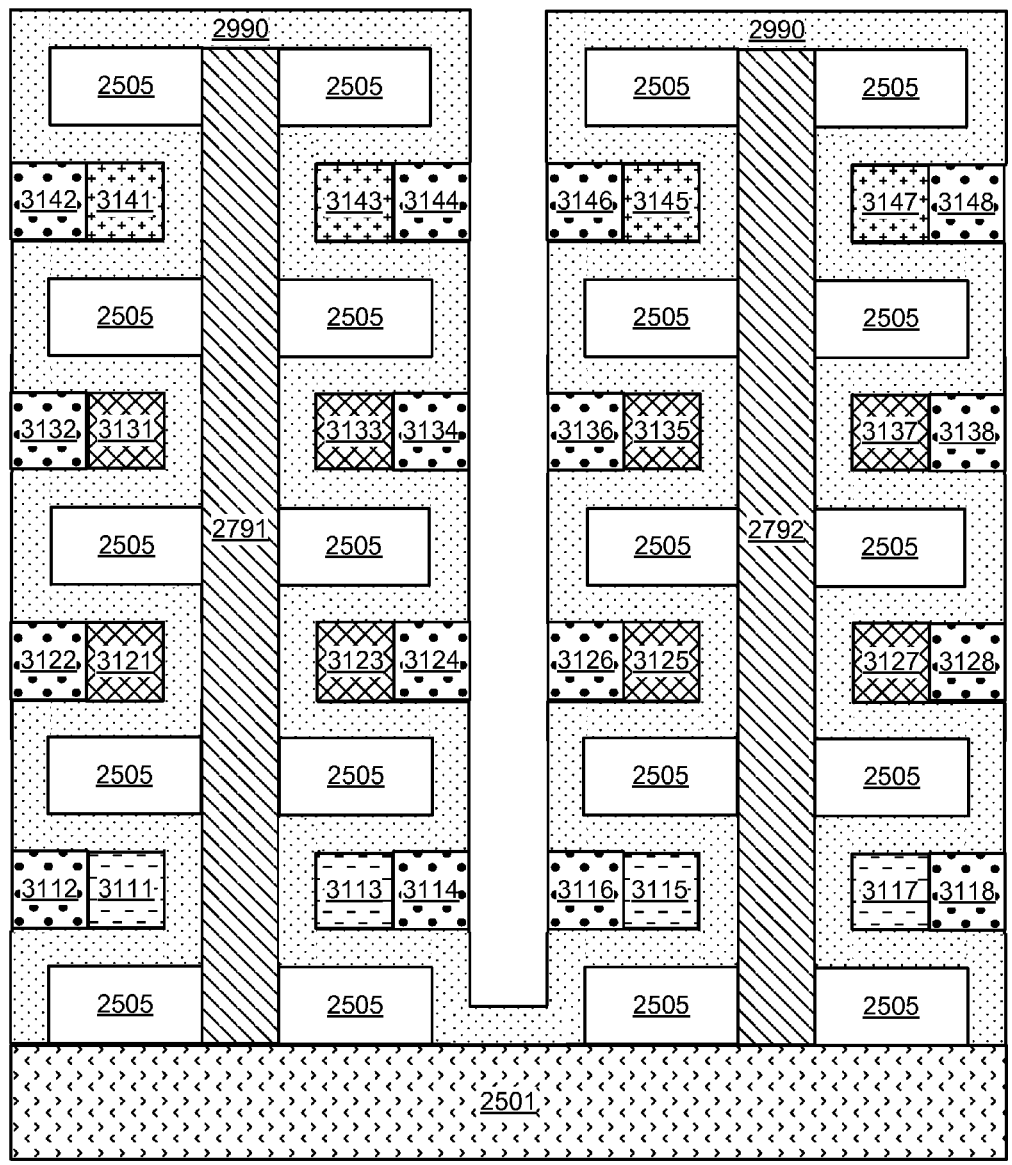

In an alternative embodiment, as illustrated in FIG. 33, the memory device can include pairs of adjacent stacks in the plurality of stacks of conductive strips, wherein a memory layer 2990, that can include a multilayer dielectric charge storage structure, is disposed in interface regions at cross-points between side surfaces of a first side of conductive strips such as 3131 and 3133 in the intermediate planes (WLs) and the inter-stack semiconductor body elements such as 2791 in the plurality of bit line structures. The memory device can further include sidewall silicide formations such as 3132 and 3134 disposed on side surfaces on a second side of the conductive strips such as 3131 and 3133 opposite the first side in the intermediate planes (WLs) of conductive strips in the pairs of adjacent stacks.

The sidewall silicide formations are parallel to the word lines in the intermediate planes (WLs) of conductive strips, and orthogonal to the inter-stack semiconductor body elements in the plurality of bit line structures. Further description of the alternative embodiment is provided in connection with FIGS. 25 through 33.

Figure 8:
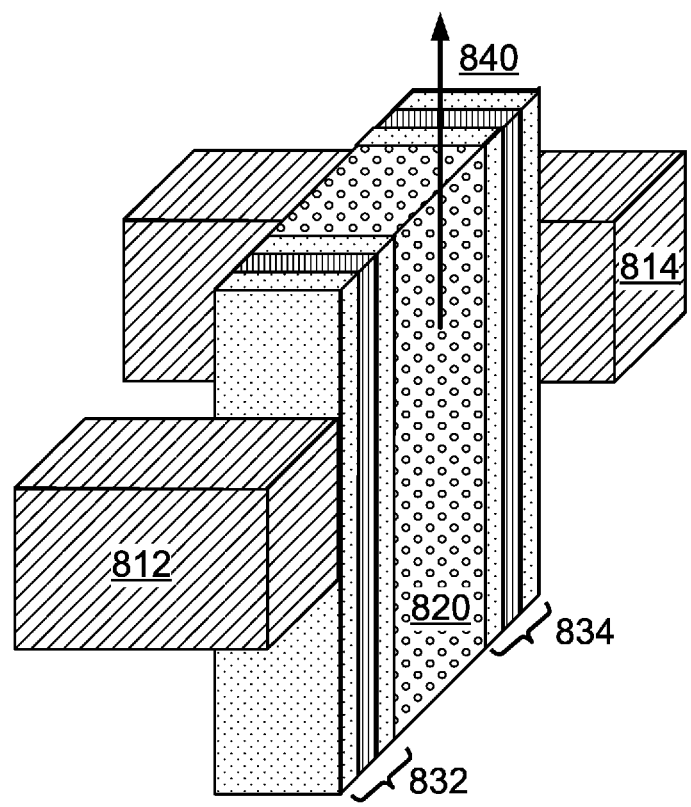
FIG. 8 is a 3D schematic diagram illustrating a vertical channel structure.

FIG. 8 is a 3D schematic diagram illustrating a vertical channel structure. In the example shown in FIG. 8, the double-gate vertical channel structure includes dielectric layers arranged as charge storage structures 832 and 834 between side surfaces of the horizontal gates 812 and 814, respectively, and vertical channel 820. Current flow is vertical as represented by arrow 840 through vertical channel 820. The gates 812 and 814 are parts of conductive strips in the intermediate planes (WLs) in the stacks. The conductive strips can comprise a variety materials including doped semiconductors, metals, and conductive compounds like Si, Ge, SiGe, SiC, TiN, TaN, W, and Pt. Vertical channel 820 is a part of a bit line structure in the memory device, and can comprise semiconductor materials adapted to act as channels for the memory cells, such materials as Si, Ge, SiGE, GaAs, SiC, and Graphene. Charge storage structures in the memory device, including charge storage structures 832 and 834, can comprise multilayer dielectric charge trapping structures known from flash memory technologies known in the art as SONOS, BE-SONOS, TANOS, and MA BE-SONOS.

Figure 9:
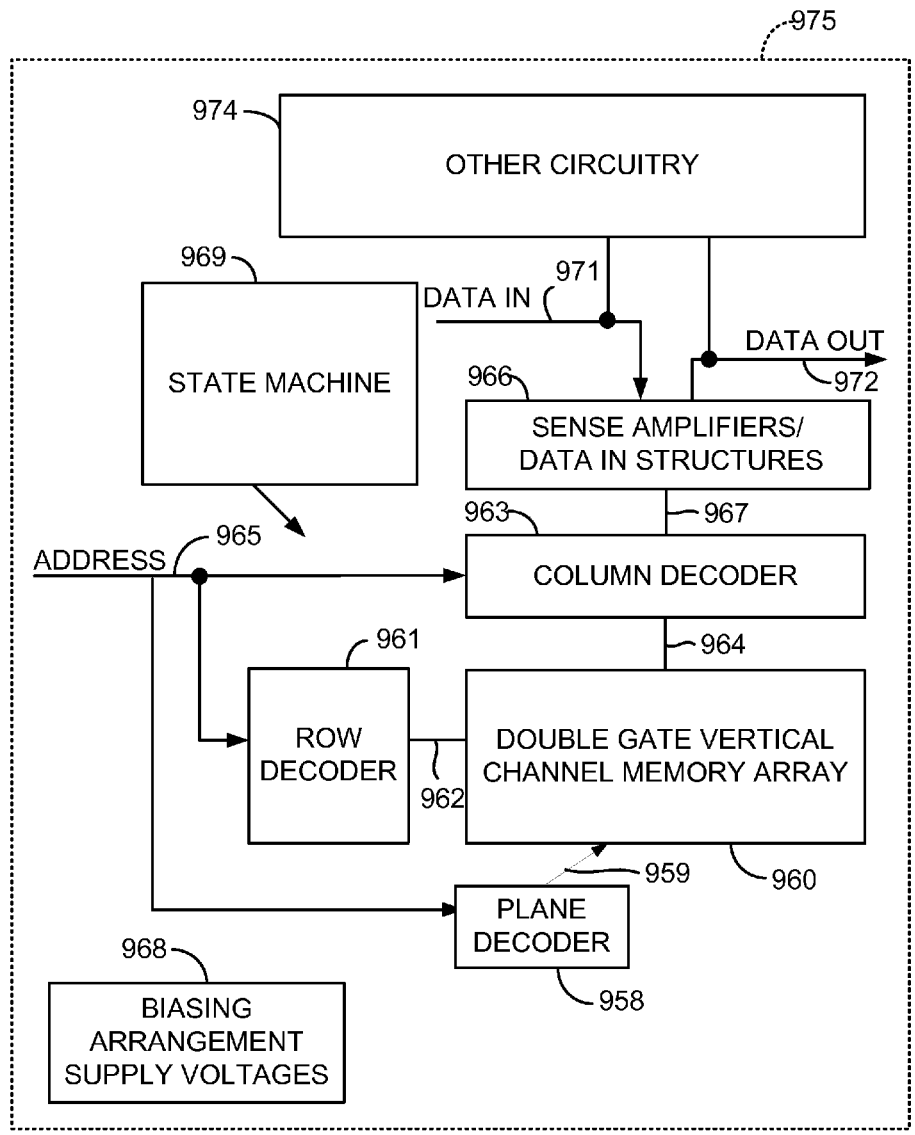
FIG. 9 is a simplified block diagram of an integrated circuit according to an embodiment of the present invention.

FIG. 9 is a simplified block diagram of an integrated circuit according to an embodiment of the present invention. In the example shown in FIG. 9, the integrated circuit 975 includes a double-gate vertical channel memory array 960 (DGVC) implemented with one or both of the source line structures and silicide formations on word line structures, as described herein, on a integrated circuit substrate. A row decoder 961 is coupled to a plurality of word lines 962, and arranged along rows in the memory array 960. A column decoder 963 is coupled to a plurality of bit lines 964 (or SSL lines as described above) arranged along columns in the memory array 960 for reading and programming data from the memory cells in the memory array 960. A plane decoder 958 is coupled to a plurality of planes in the memory array 960 on SSL lines 959 (or bit lines as described above). Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the programmable resistance cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read and program voltages. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

Figure 10:
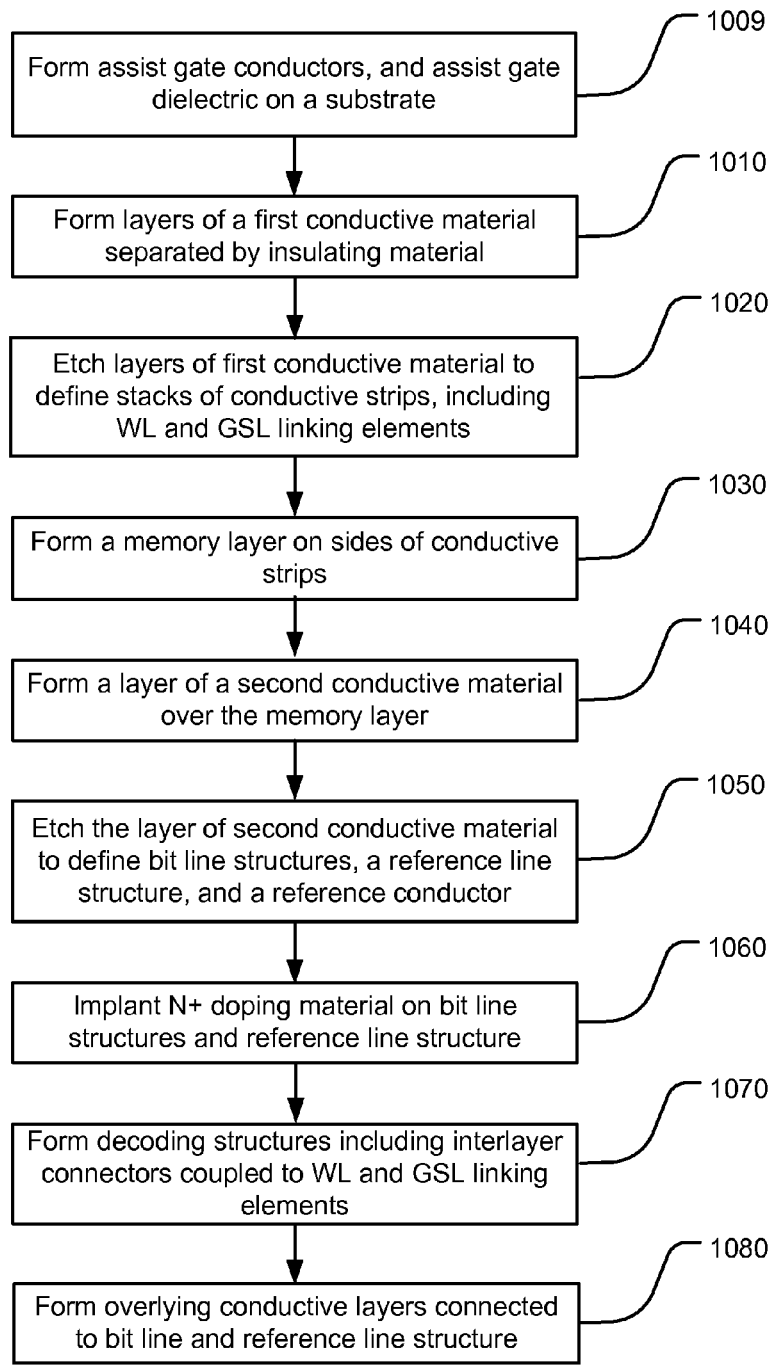
FIG. 10 is a flow chart illustrating a method for manufacturing a double-gate vertical channel structure.

FIG. 10 is a flow chart illustrating a method for manufacturing a memory device. The method includes identifying areas on a substrate for formation of 3D memory blocks having a structure like that of FIG. 1. For each area, the method includes forming assist gate conductors by implanting assist gate wells in the substrate, or by patterning conductive material on the substrate. Over the assist gate conductors, a layer of assist gate dielectric, such as silicon dioxide is formed (block 1009). Over the insulating layer, the process includes forming a plurality of layers of a first conductive material separated by insulating material (block 1010), and etching the plurality of layers to define a plurality of stacks of conductive strips (block 1020). The stacks includes at least a bottom plane (GSL) of conductive strips, a plurality of intermediate planes (WLs) of conductive strips, and a top plane of conductive strips (SSLs).

The method includes forming a memory layer on side surfaces of conductive strips in the plurality of stacks (block 1030). The memory layer contacts side surfaces of the plurality of conductive strips. The method includes forming a layer of a second conductive material over and having a surface conformal with the memory layer on the plurality of stacks (block 1040).

The method includes etching the layer of second conductive material to define a plurality of bit line structures (block 1050) arranged orthogonally over, and having surfaces conformal with, the plurality of stacks. The bit line structures include inter-stack semiconductor body elements between the stacks and linking elements over the stacks connecting the inter-stack semiconductor body elements.

The step of etching the layer of second conductive material (block 1050) is also used in this example, to define at least one reference line structure (block 1050) arranged orthogonally over the plurality of stacks. The reference line structure includes inter-stack vertical conductive elements between the stacks in electrical communication with the layer of common source conductor material. Also, the reference line structure can include linking elements over the stacks connecting the inter-stack vertical conductive elements. The step of etching the layer of second conductive material stops at a level above the layer of assist gate dielectric such that portions of the layer of second conductive material below the level remain to form a reference conductor. The reference conductor is connected to the reference line structure and the bit line structures to allow electrical communication from the reference line structure to the bit line structures (block 1050).

As a result of forming the bit line structures, memory cells are formed in interface regions at cross-points between side surfaces of the conductive strips in the plurality of intermediate planes (WLs) in the stacks and the inter-stack semiconductor body elements of the plurality of bit line structures. Also, string select switches are disposed at interface regions with the top plane of conductive strips (SSLs), and reference select switches are disposed at interface regions with the bottom plane (GSL) of conductive strips. The memory layer can comprise dielectric layers that can act as the gate dielectric layers for the string select switches and reference select switches.

In one embodiment, the method can include implanting N+ doping material, with a first energy level, on the linking elements in the plurality of bit line structures, the reference conductor, and the linking elements in the at least one reference line structure (block 1060). The method can further include implanting N+ doping material, with a second energy level, on the inter-stack vertical conductive elements of the at least one reference line structure (block 1060), wherein the second energy level is higher than the first energy level.

The inter-stack vertical conductive elements in the at least one reference line structure can have a larger cross-sectional area than the inter-stack semiconductor body elements in the bit line structures, as illustrated in FIG. 2.

In one embodiment, the step of etching the plurality of layers to define a plurality of stacks of conductive strips (block 1020) in the method can include forming linking elements connecting sets of word lines in the intermediate planes (WL) as part of a decoding structure. The method further includes forming openings in the linking elements, and forming interlayer connectors coupled to landing areas in the linking elements as another part of the decoding structure, where the interlayer connectors coupled to landing areas in lower intermediate planes extend through the openings in the linking elements (block 1070).

The step of etching the plurality of layers to define a plurality of stacks of conductive strips (block 1020) in the method can further include forming linking elements connecting sets of ground selection lines in the bottom plane. The method further includes forming interlayer connectors coupled to landing areas in the linking elements in the bottom plane, where the interlayer connectors extend through the openings in the linking elements in the intermediate planes (WLs) (block 1070).

In one embodiment, a group of bit lines in the bit line structures and at least a source line in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on the same side of the group.

In an alternative embodiment, a group of bit lines in the bit line structures and at least a source line in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on an opposing side of the group.

In one embodiment, the method can include forming blocks that include linking elements connecting sets of word lines in the intermediate planes (WLs), and interlayer connectors coupled to landing areas in the linking elements, where ends of the word lines in adjacent blocks are connected via the linking elements, and the linking elements include openings through which interlayer connecters coupled to landing areas in lower intermediate planes extend. The method can further include forming sidewall silicide formations on at least one side of adjacent blocks parallel to word lines in the adjacent blocks.

In an alternative embodiment, the method can include forming pairs of adjacent stacks in the plurality of stacks of conductive strips, wherein charge storage structures are disposed in interface regions at cross-points between side surfaces of a first side of word lines in the intermediate planes (WLs) and the inter-stack semiconductor body elements in the plurality of bit line structures. The method can further include forming sidewall silicide formations on side surfaces of a second side of the word lines opposite the first side in the intermediate planes (WLs) of conductive strips in the pairs of adjacent stacks.

The method can further include forming a first overlying conductive layer connected to the plurality of bit line structures, including a plurality of global bit lines coupled to sensing circuits, and forming a second overlying conductive layer connected to the at least one reference line structure, coupled to a reference voltage source (block 1080).

Figure 11:
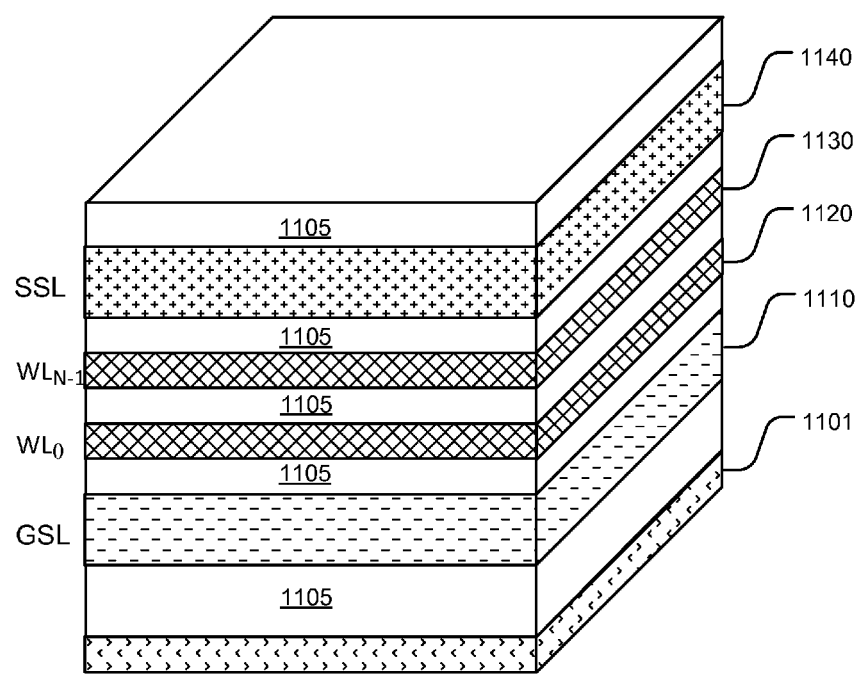
FIGS. 11 through 18 illustrate an example process flow for a double-gate vertical channel structure.

FIGS. 11 through 18 illustrate an example process flow for a double-gate vertical channel structure. FIG. 11 illustrates a stage of the process flow after forming an assist gate conductor 1101, and a plurality of layers of a first conductive material, such as layers 1110, 1120, 1130 and 1140, separated by layers of insulating material 1105, on an integrated circuit substrate (not shown).

Figure 12:
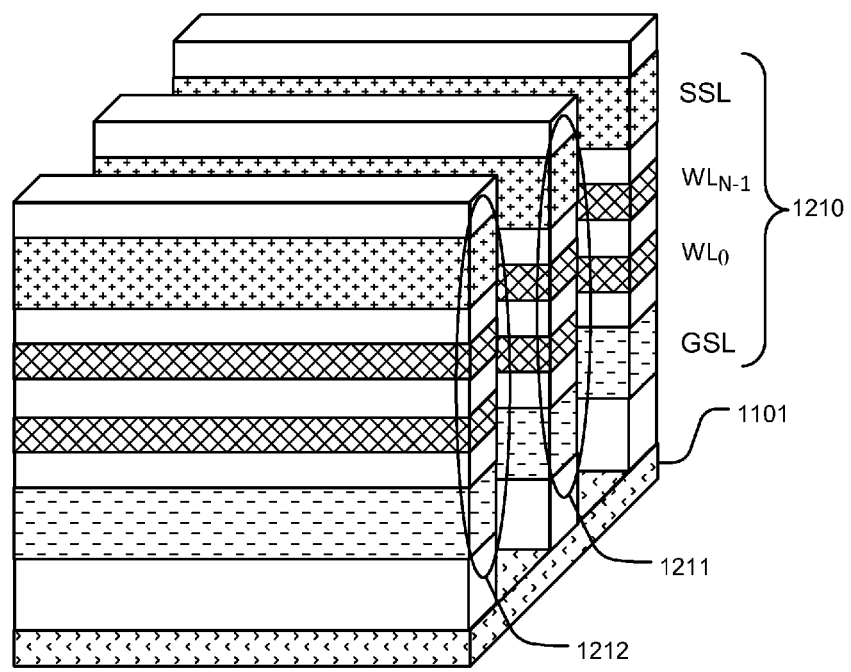

FIG. 12 illustrates a stage of the process flow after etching the plurality of layers, and stopping at the assist gate conductor 1101, to define a plurality of stacks of conductive strips, including stacks 1210, 1211 and 1212. The stacks 1210, 1211 and 1212 include at least a bottom plane (GSL) of conductive strips, a plurality of intermediate planes (WLs) of conductive strips, and a top plane of conductive strips (SSLs). The plurality of intermediate planes can include N planes, ranging from 0 to N−1, as illustrated in FIG. 12, for the stack 1210. Although not shown, the conductive strips are linked by pads defined in the pattern used for etching the stacks. The pads can be used to form linking elements, like those of FIGS. 4 and 5 above, in subsequent steps.

Figure 13:
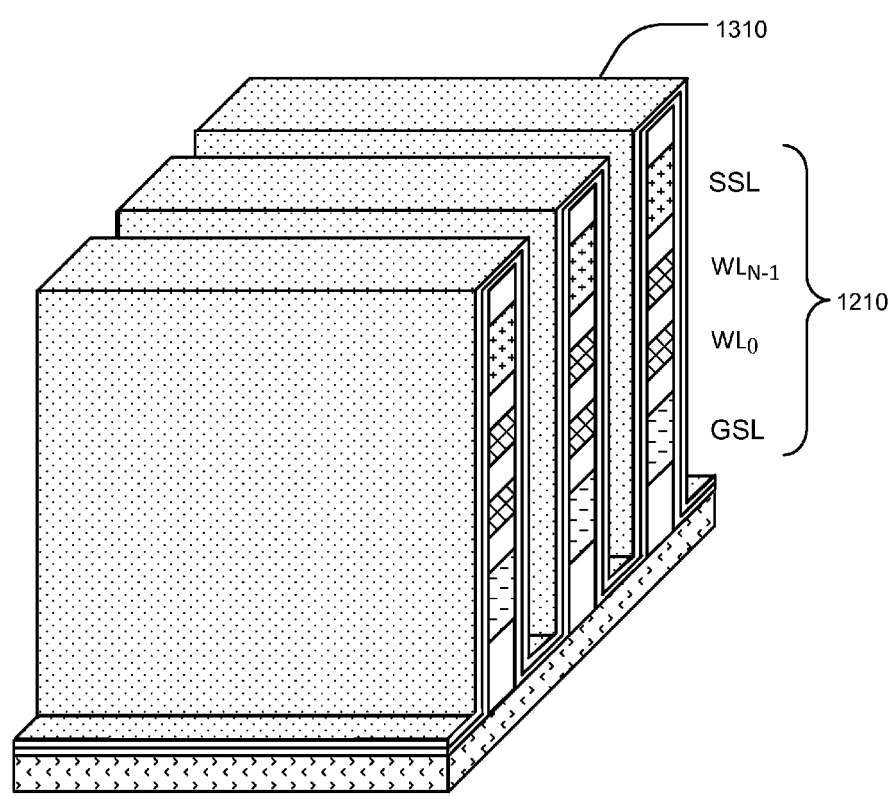

FIG. 13 illustrates a stage of the process flow after forming a memory layer 1310 over and on sides of conductive strips in the plurality of stacks, including the stack 1210. The memory layer 1310 contacts side surfaces of the plurality of conductive strips. The memory layer 1310 can comprise a multlilayer, dielectric charge storage structure as discussed above.

Figure 14:
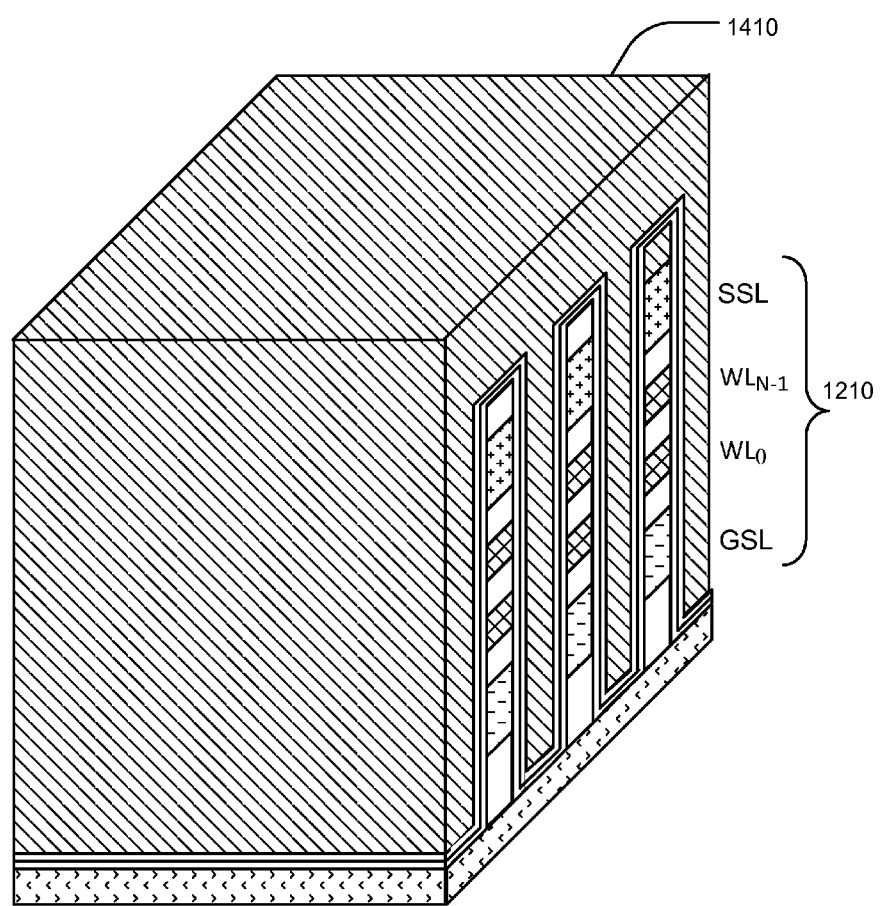

FIG. 14 illustrates a stage of the process flow after forming a layer of a second conductive material 1410 over, and having a surface conformal with, the memory layer 1310 on the plurality of stacks, including the stack 1210. The second conductive material comprises a semiconductor adapted at least in the regions between the stacks, to act as channel regions for vertical strings of memory cells.

Figure 15:
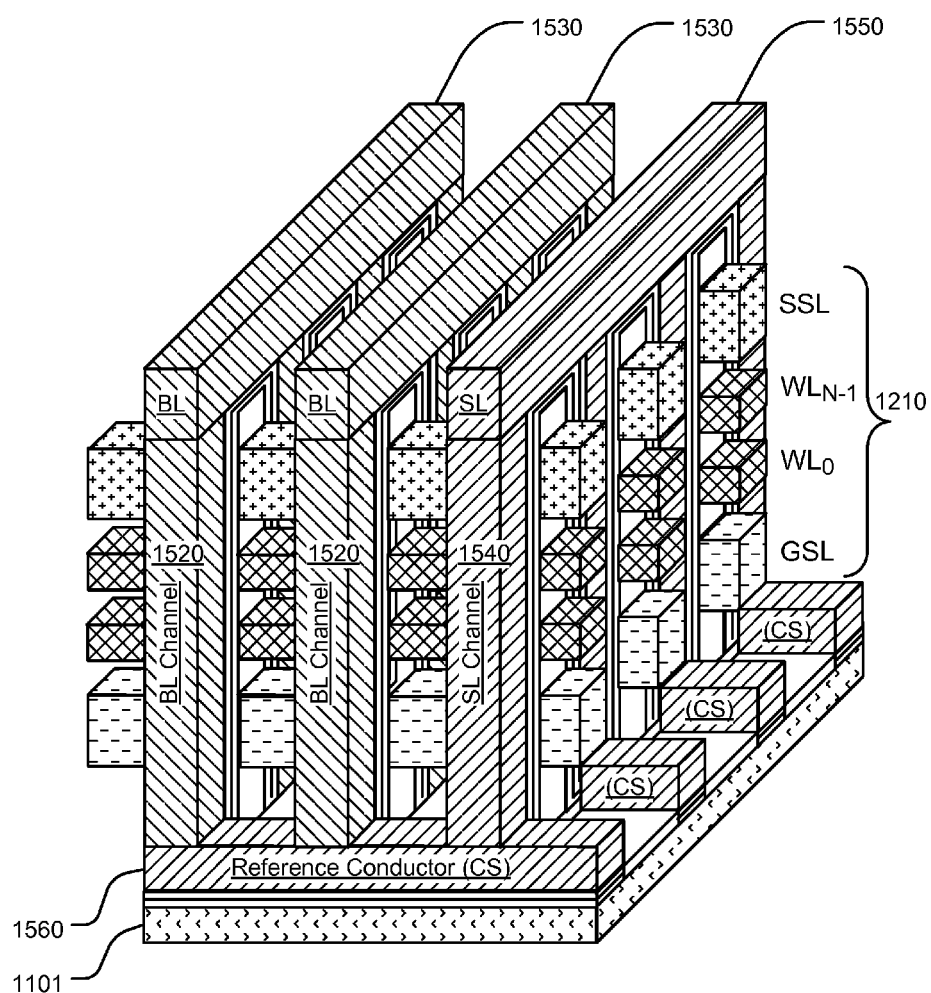

FIG. 15 illustrates a stage of the process flow after a patterned and timed etch of the layer of second conductive material 1410, which is timed to stop before reaching the memory layer 1310 between the stacks, so that a reference conductor (e.g. 1560) is formed between each stack. Other processes to stop the etching in order to form the reference conductor can be used as well, including the use of an etch stop layer, disposed in the second conductor material in the trenches at the desired depth. The pattern of the etch defines a plurality of bit line structures 1520/1530 arranged orthogonally over, and having surfaces conformal with, the plurality of stacks, including the stack 1210. The bit line structures 1520/1530 include inter-stack semiconductor body elements 1520 between the stacks extending to the reference conductors (e.g. 1560), and linking elements 1530 over the stacks connecting the semiconductor body elements 1520. To reveal underlying structure, the illustration shows openings between the conductive strips in the stacks, in the regions between the bit line structures. However, these openings will be filled with an insulating material between the strips in the stacks.

The step of etching the layer of second conductive material also defines at least one reference line structure 1540/1550, arranged orthogonally over the plurality of stacks. The reference line structure includes inter-stack vertical conductive elements 1540 extending to the reference conductor (e.g., 1560) between the stacks and linking elements 1550 over the stacks connecting the inter-stack vertical conductive elements 1540.

FIG. 15 illustrates that the reference conductor 1560 left as a result of the patterned, timed etch is disposed between the bottom plane (GSL) of conductive strips and the assist gate structure 1101 on the substrate.

The memory layer 1310 can act as an assist gate dielectric between the reference conductor 1560 and the assist gate conductor 1101

Figure 16:
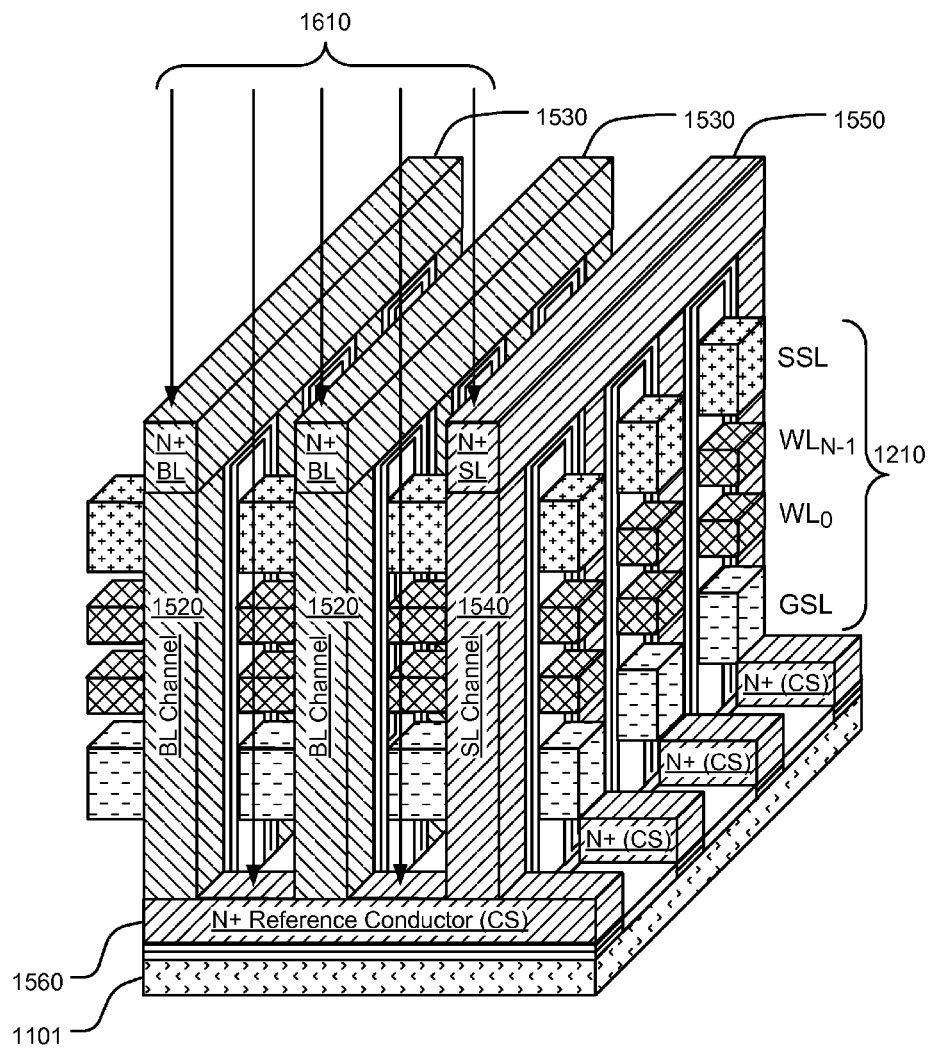

FIG. 16 illustrates a stage of the process flow after the bit line structures are formed, where the process includes implanting N+ doping material in the direction shown by arrows 1610, with a first energy level, on the linking elements 1530 in the plurality of bit line structures, the reference conductor 1560 in exposed areas between the bit line structures, and between the bit line structure and the reference line structure, and the linking elements 1550 in the at least one reference line structure. The first energy level can be less than 30 keV, with a typical dose around 1E14 per $cm^2$.

If the profile of the inter-stack semiconductor body elements 1520 of the bit line structures is sufficiently vertical (nearly 90 degrees) to the reference conductor 1560, sidewalls of the inter-stack semiconductor body elements 1520 of the bit line structures receive a minimal amount of the N+ doping material with the first energy level, while most of the N+ doping material is implanted into the reference conductor 1560, reducing its resistance accordingly.

Figure 17:
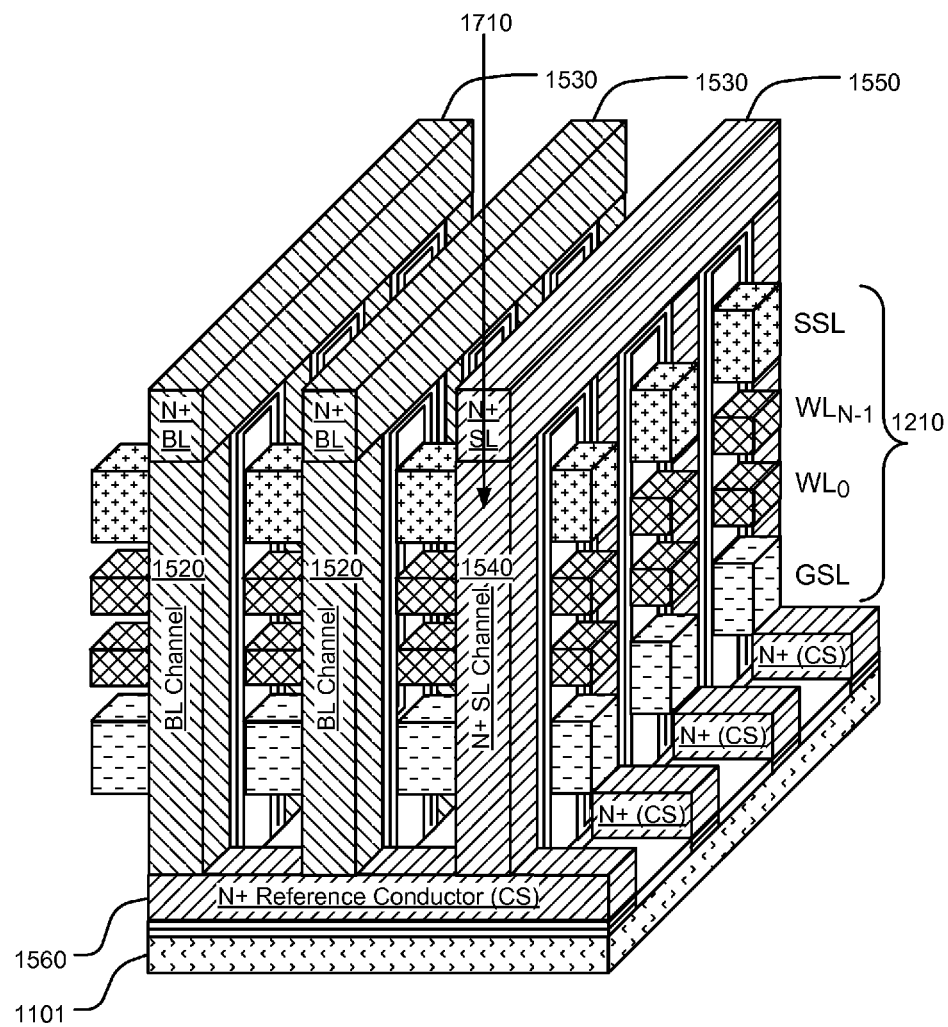

FIG. 17 illustrates a stage of the process flow following the implant of FIG. 16, where the process flow includes an additional step of implanting N+ doping material in the direction shown by arrow 1710, with a second energy level, on the inter-stack vertical conductive elements 1540 of the at least one reference line structure, wherein the second energy level is higher than the first energy level. For instance, the second energy level can be around 30 to 50 keV, with a typical dose around 1E14 to 1E15 per $cm^2$. An implant mask (not shown) can be used to protect the bit line structures and other parts of the memory array from this additional step of implanting. This can improve the conductivity of the inter-stack vertical conductive elements 1540 for the reference line structure.

The inter-stack vertical conductive elements 1540 in the at least one reference line structure can have a larger cross-sectional area than the inter-stack semiconductor body elements 1520 in the bit line structures, as illustrated in FIG. 2.

Figure 18:
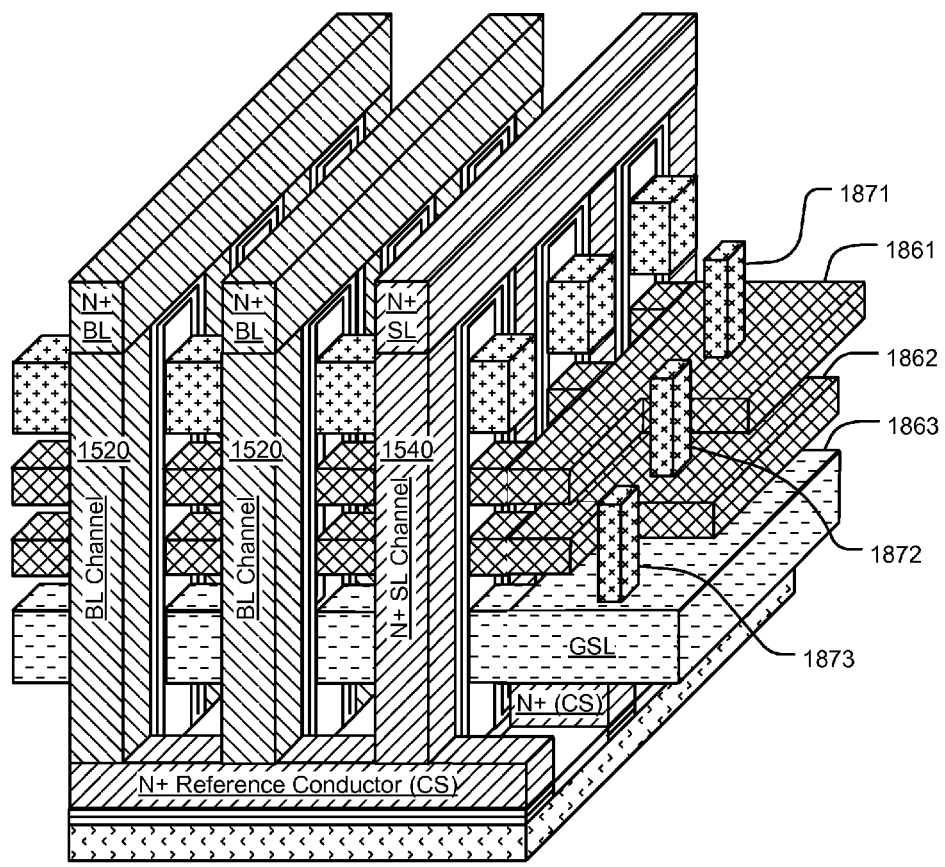

FIG. 18 illustrates a stage of the process flow following a staircase etching process used to isolate the individual SSL lines, and to form linking elements 1861, 1862, 1863 coupled to the conductive strips in the plurality of stacks that include landing areas for interlayer connectors 1871, 1872, 1873. The pads used for linking elements 1861, 1862, 1863 can be patterned at the same time that the stacks are patterned (See, FIG. 12).

In one embodiment, as illustrated in FIG. 4, a group 430 of bit lines in the bit line structures and at least a linking element 440 in the at least one reference line structure are arranged orthogonally over a first set 410 of word lines in the intermediate planes (WL), and a second adjacent set 420 of word lines in the intermediate planes (WL), and interlayer connectors 471 through 474 for the first set 410 are arranged on a side of the group 430 parallel to the bit lines in the group 430, and interlayer connectors 491 through 492 for the second set 420 are arranged on the same side of the group 430.

In an alternative embodiment, as illustrated by FIG. 5, a group 530 of linking elements 531 through 538 in the bit line structures and at least a linking element 540 in the at least one reference line structure are arranged orthogonally over a first set 510 of word lines in the intermediate planes (WL), and a second adjacent set 520 of word lines in the intermediate planes (WL), and interlayer connectors 571 through 574 for the first set 510 are arranged on a side of the group 530 parallel to the bit lines in the group 530, and interlayer connectors 591 through 594 for the second set 520 are arranged on an opposing side of the group 530.

In one embodiment, the process flow can include forming blocks that include linking elements connecting sets of word lines in the intermediate planes (WLs), and interlayer connectors coupled to landing areas in the linking elements, where ends of the word lines in adjacent blocks are connected via the linking elements, and the linking elements include openings through which interlayer connecters coupled to landing areas in lower intermediate planes extend. The process flow can further include forming sidewall silicide formations on at least one side of adjacent blocks parallel to word lines in the adjacent blocks. Sidewall silicide formations can be $CoSi_x$ (cobalt silicide), $TiSi_x$ (titanium silicide), or other silicide compounds, made for example using SAlicide (self-aligned silicide) processes on sidewalls of sets of word lines.

Figure 19:
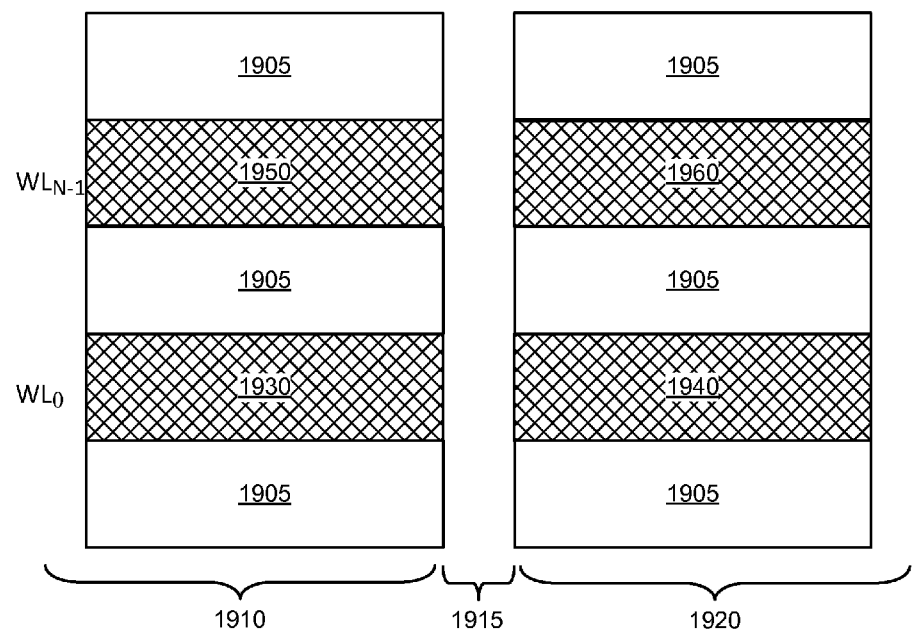
FIGS. 19 through 24 illustrate an example process flow for an embodiment in a sidewall silicide formation in a vertical channel structure.

FIGS. 19 through 24 illustrate an example process flow for an embodiment in a sidewall silicide formation in a vertical channel structure. FIG. 19 is a cross-section taken orthogonally to the conductive strips in a structure like that of FIG. 11, including the intermediate planes of conductive strips 1930, 1940, 1950, 1960 ($WL_0$ and $WL_{N-1}$) separated by insulating material 1905, after a word line slit process. The slit process can be a patterned etch used to cut conductive strips into multiple sets of word lines, exposing sidewalls of the intermediate planes $WL_0$ and $WL_{N-1}$. FIG. 19 illustrates a first set of word lines 1910, a second set of word lines 1920, and a space 1915 between the two sets, where individual word lines are to be formed.

Although the top plane of conductive strips (SSLs) and the bottom plane (GSL) of conductive strips are not shown in FIGS. 19 through 24, the process flow can include forming a sidewall silicide formation on a side of a set of string selection lines in the top plane, and on a side of a set of ground selection lines in the bottom plane.

Figure 20:
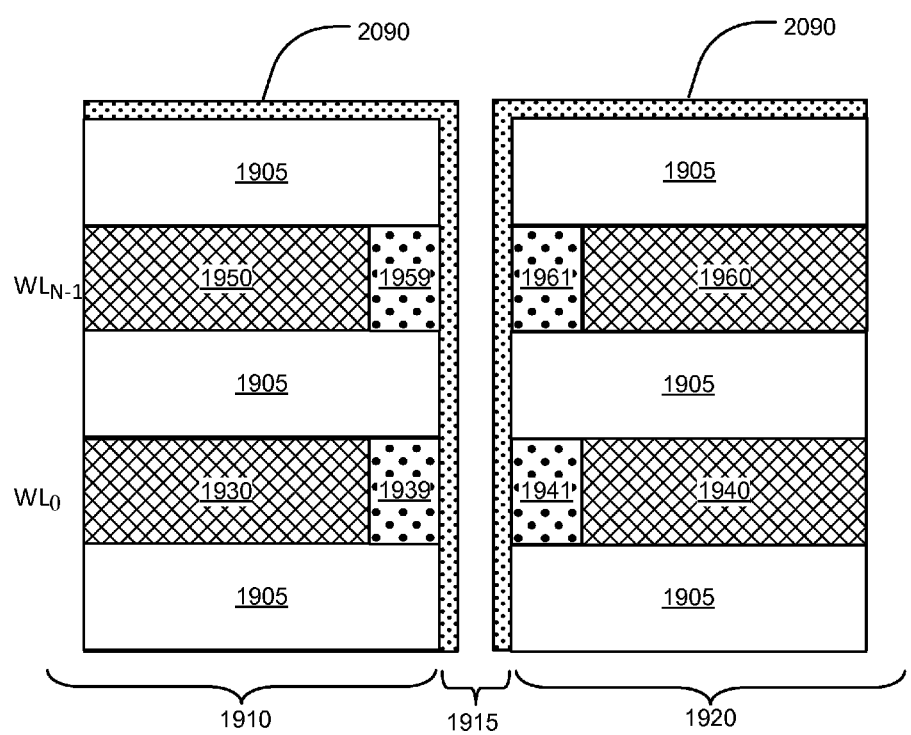
Figure 21:
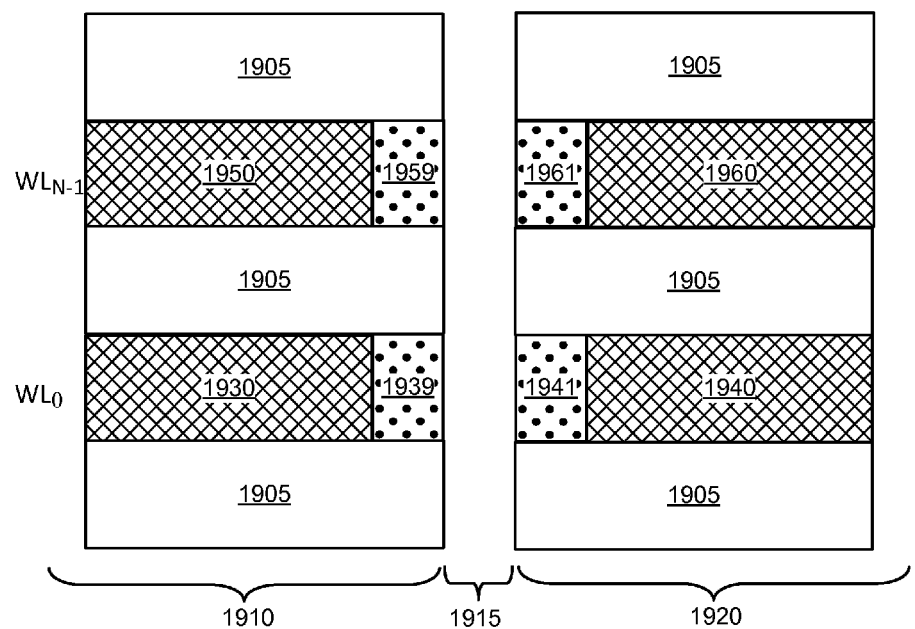

FIG. 20 illustrates a stage in the process after a procedure to form silicide on the exposed sides between the conductive strips 1930, 1940, 1950, 1960, while preventing silicide formation on the opposing sides. The silicide can be formed by depositing a thin silicide precursor, such as a transition metal layer 2090 over sidewalls of the two sets of word lines. Then the structure is annealed, causing the silicide precursor to react with the conductive material in the intermediate planes $WL_0$ and $WL_{N-1}$ to form low-resistance sidewall silicide formations, such as sidewall silicide formations 1939 and 1959 for the first set of word lines 1910, and sidewall silicide formations 1941 and 1961 for the second set of word lines 1920. As shown in FIG. 21, after the reaction to form the sidewall silicide formations 1939, 1959, 1941 and 1961, remaining or excess transition metal is etched away.

Figure 22:
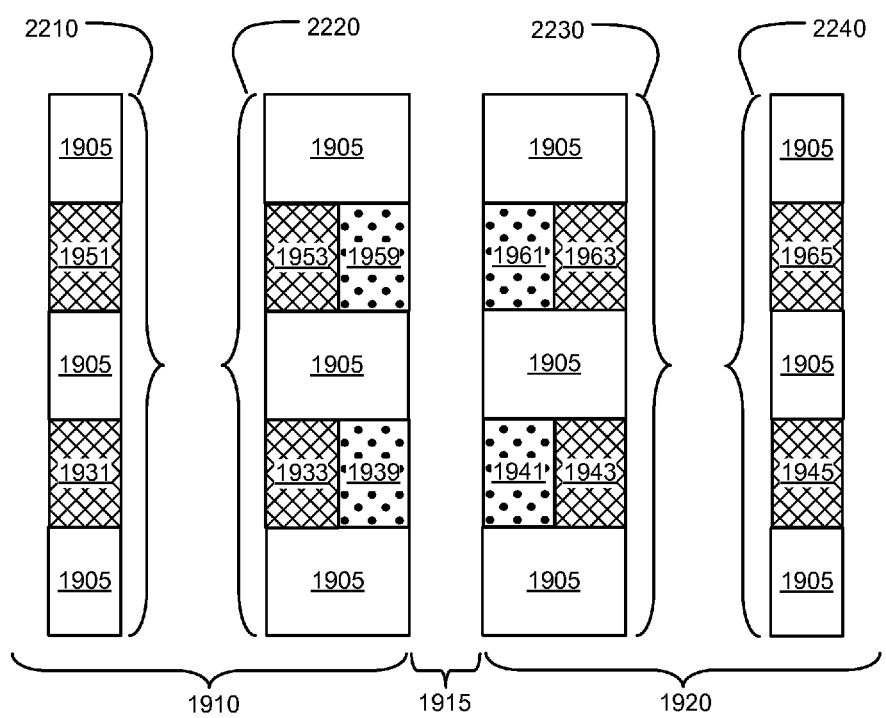

FIG. 22 illustrates a stage in the process after etching the plurality of layers to divide the conductive strips 1930, 1940, 1950, 1960, forming divided strips 1931, 1933, 1943, 1945, 1951, 1953, 1963, and 1965. The divided strips define a plurality of stacks of conductive strips, such as stacks 2210 and 2220 for the first set of word lines 1910, and stacks 2230 and 2240 for the second set of word lines 1920. The stacks include at least a bottom plane (GSL) of conductive strips (not shown), a plurality of intermediate planes (WLs) of conductive strips, and a top plane of conductive strips (SSLs) (not shown). The plurality of intermediate planes can include N planes, ranging from 0 to N−1.

Figure 23:
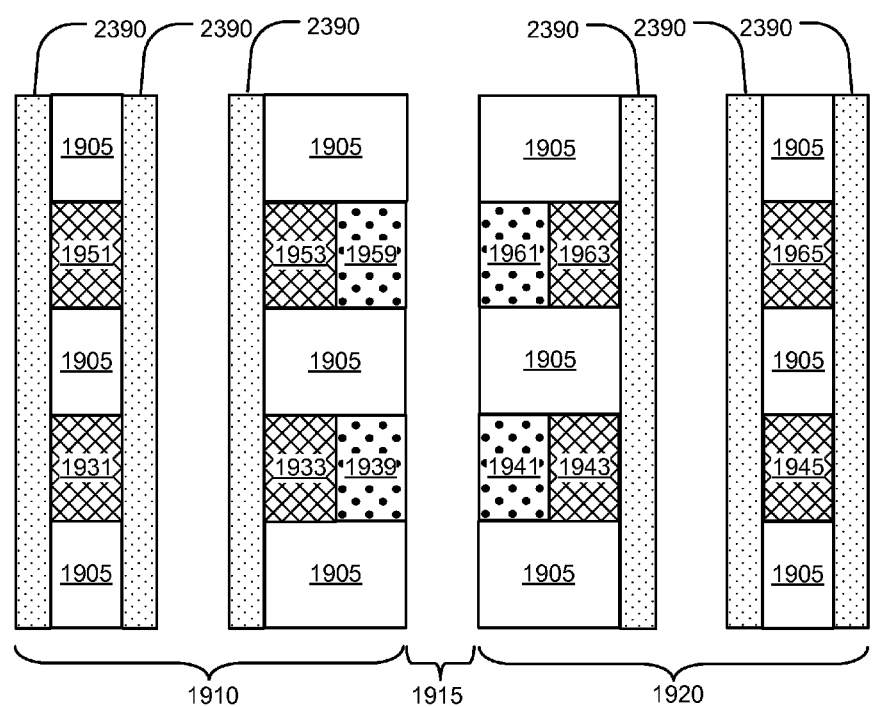

FIG. 23 illustrates a stage in the process after forming a memory layer 2390 on side surfaces of conductive strips in the plurality of stacks, in regions not covered by the sidewall silicide formations 1939, 1959, 1941 and 1961. The memory layer 2390 contacts side surfaces of the plurality of conductive strips.

Figure 24:
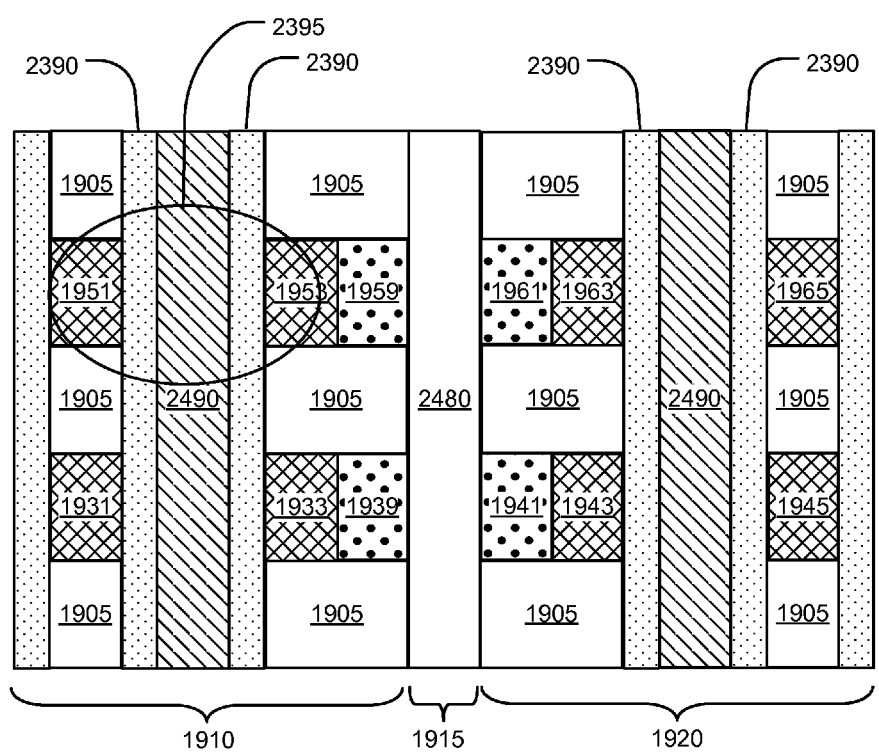

FIG. 24 illustrates a stage in the process after forming a layer of a second conductive material to form a vertical inter-stack semiconductor body element 2490 over, and having a surface conformal with, the memory layer 2390 on the plurality of stacks. The space 1915 between the two sets of word lines is filled with insulation material 2480 at some position in the process flow. A double-gate, flash memory cell (region 2395) results at a cross-point of the conductive strips 1951 and 1953 with the vertical inter-stack semiconductor body element 2490 of the bit line structure, and at other similar cross-points to form a 3D memory array. The process flow can then continue as described with reference to FIG. 15 to etch the layer of second conductive material, and so on.

Figure 25:
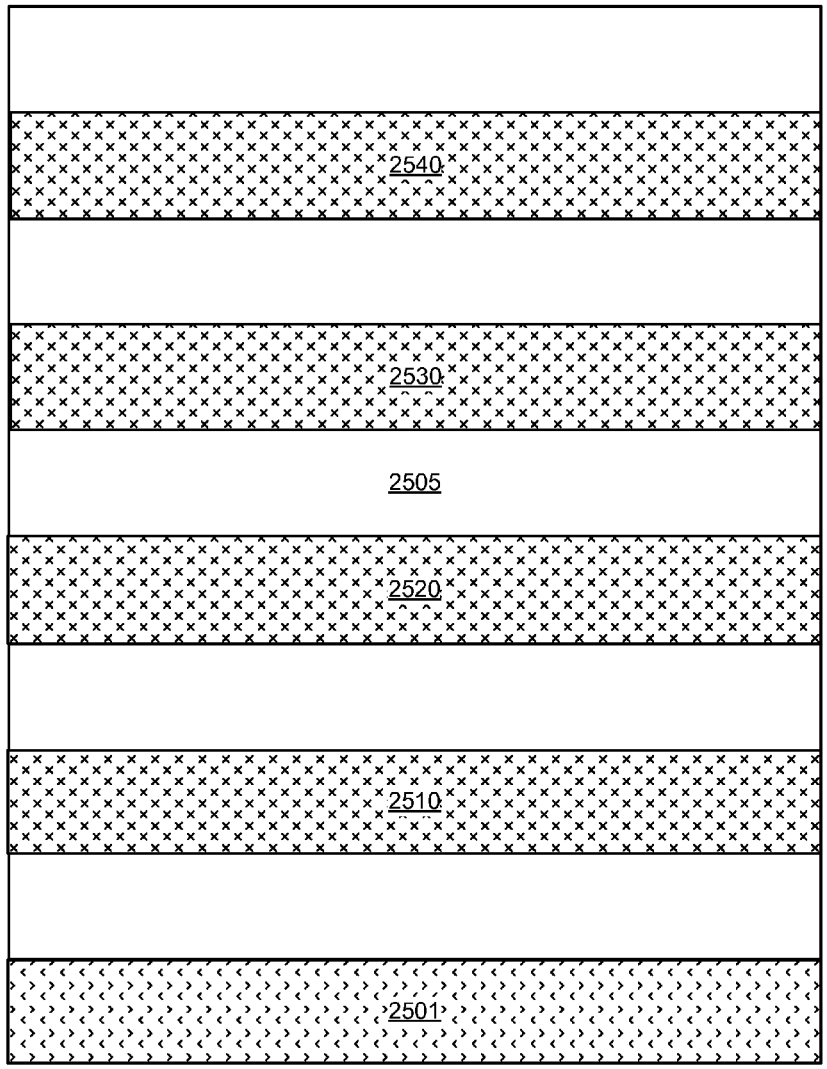
FIGS. 25 through 33 illustrate an example process flow for an alternative embodiment in a sidewall silicide formation in a vertical channel structure.

FIGS. 25 through 33 illustrate an example process flow for an alternative embodiment in a sidewall silicide formation in a vertical channel structure. In the alternative embodiment, charge storage structures are disposed in interface regions at cross-points between side surfaces of a first side of word lines in the intermediate planes (WLs) and the inter-stack semiconductor body elements in the plurality of bit line structures, and sidewall silicide formations are disposed on side surfaces of a second side of the word lines opposite the first side in the intermediate planes (WLs) of conductive strips in the pairs of adjacent stacks. FIG. 25 illustrates a cross-section of a partially fabricated memory device. In the example shown in FIG. 25, the memory device includes a reference conductor layer 2501, and a plurality of sacrificial layers, including sacrificial layers 2510, 2520, 2530 and 2540, separated by insulating material 2505.

Figure 26:
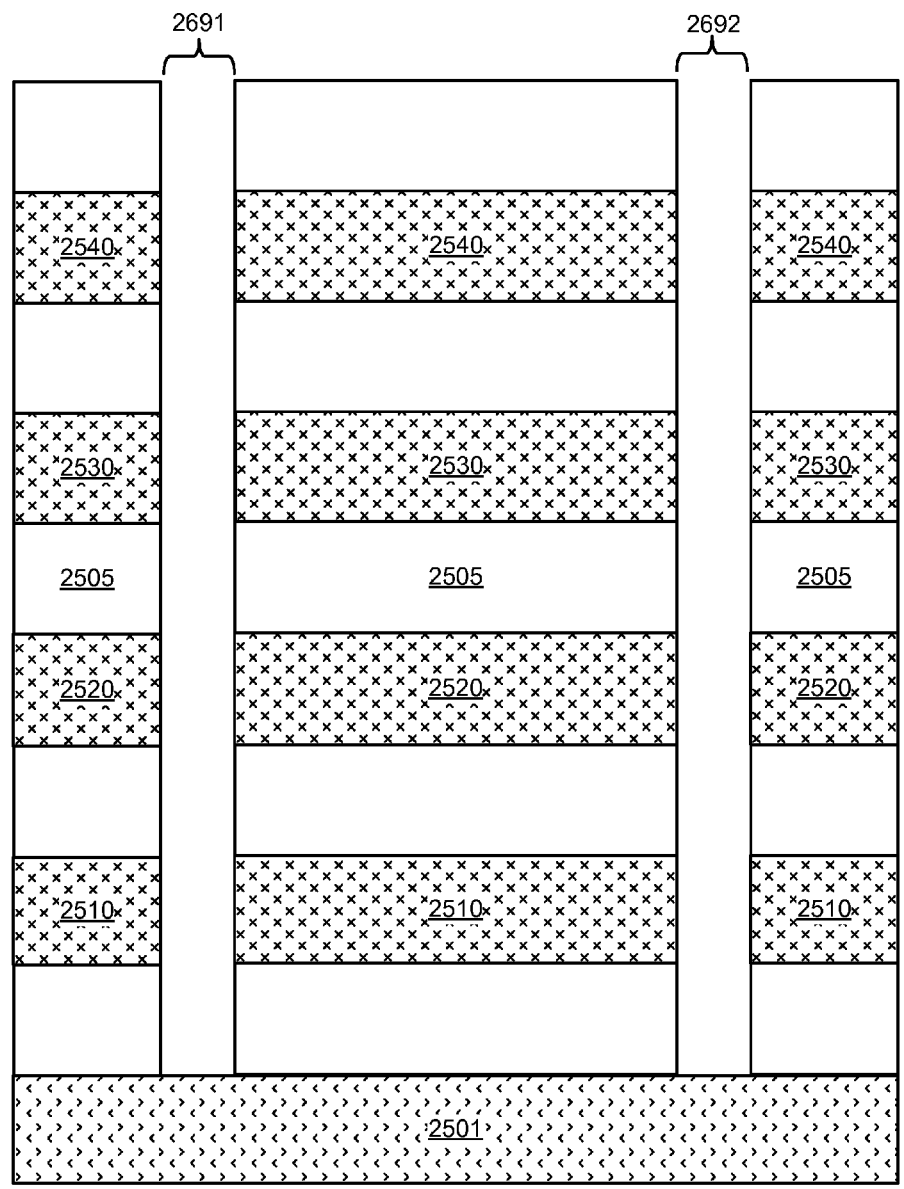

FIG. 26 illustrates a stage in the process after etching the plurality of sacrificial layers to define a plurality of pairs of adjacent stacks, by forming openings 2691 and 2692 etched through the plurality of sacrificial layers. The openings 2691 and 2692 are used to form the inter-stack semiconductor body elements shared by the pairs of adjacent stacks.

Figure 27:
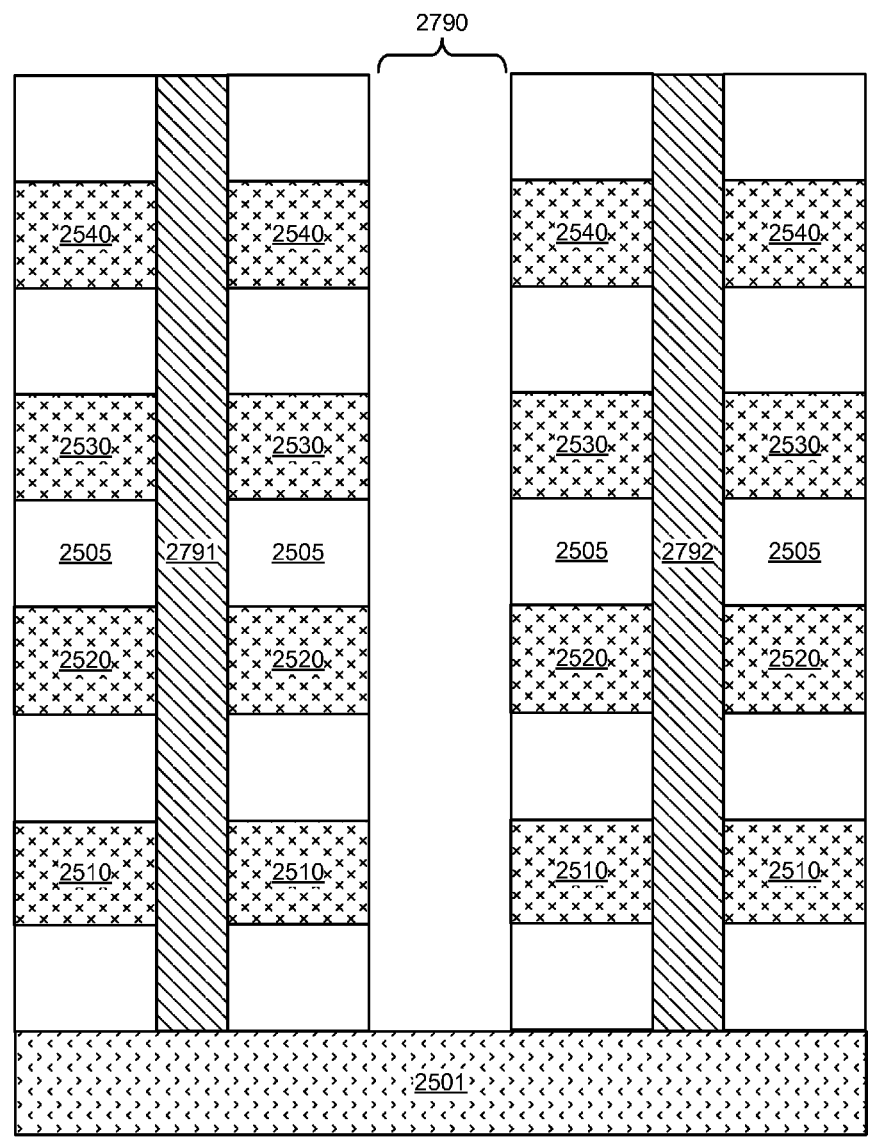

FIG. 27 illustrates a stage in the process after forming the inter-stack semiconductor body elements 2791 and 2792 in openings 2691 and 2692, respectively, using the second conductive material, and etching openings, such as an opening 2790 extending to the reference conductor layer 2501, to expose sacrificial layers 2510, 2520, 2530 and 2540, and to separate pairs of adjacent stacks.

Figure 28:
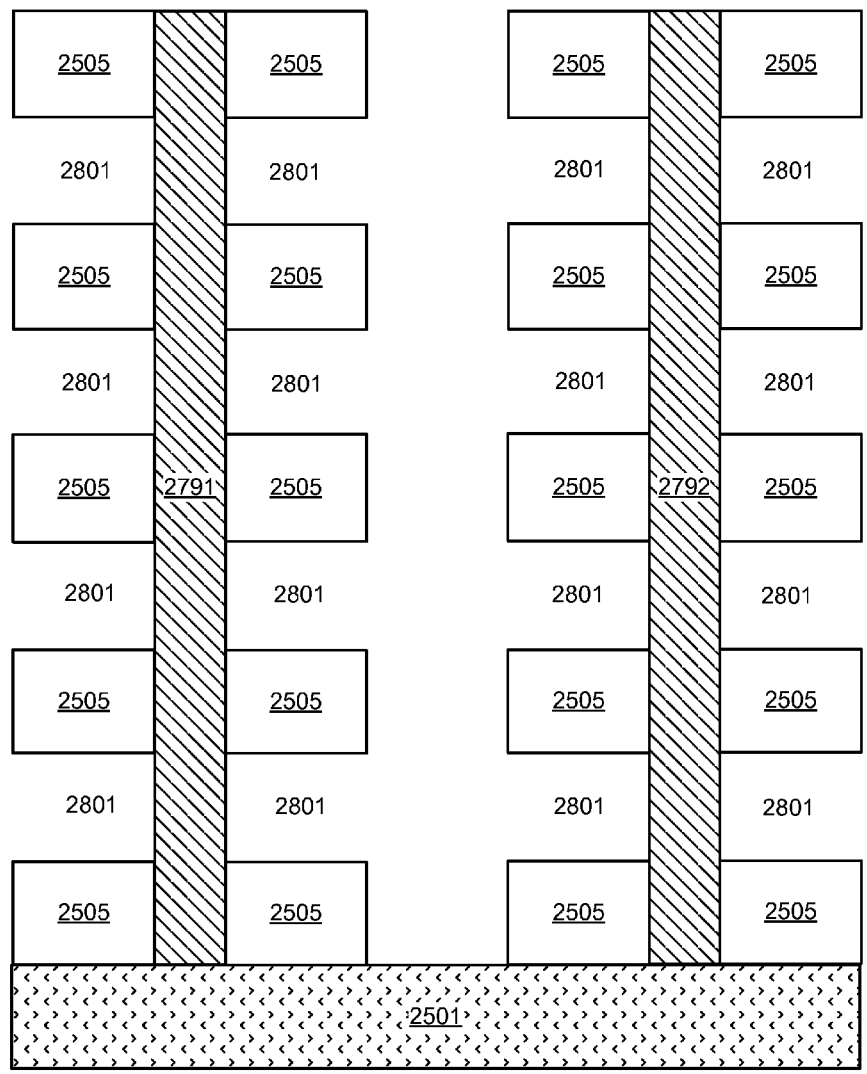

FIG. 28 illustrates a stage in the process after removing sacrificial layers 2510, 2520, 2530 and 2540 exposed by the openings such as the opening 2790. This etch process leaves layers of insulating material 2505 in the respective stacks adhered to the second conductive material that acts as the inter-stack semiconductor body elements, with openings (e.g. 2801) in between.

Figure 29:
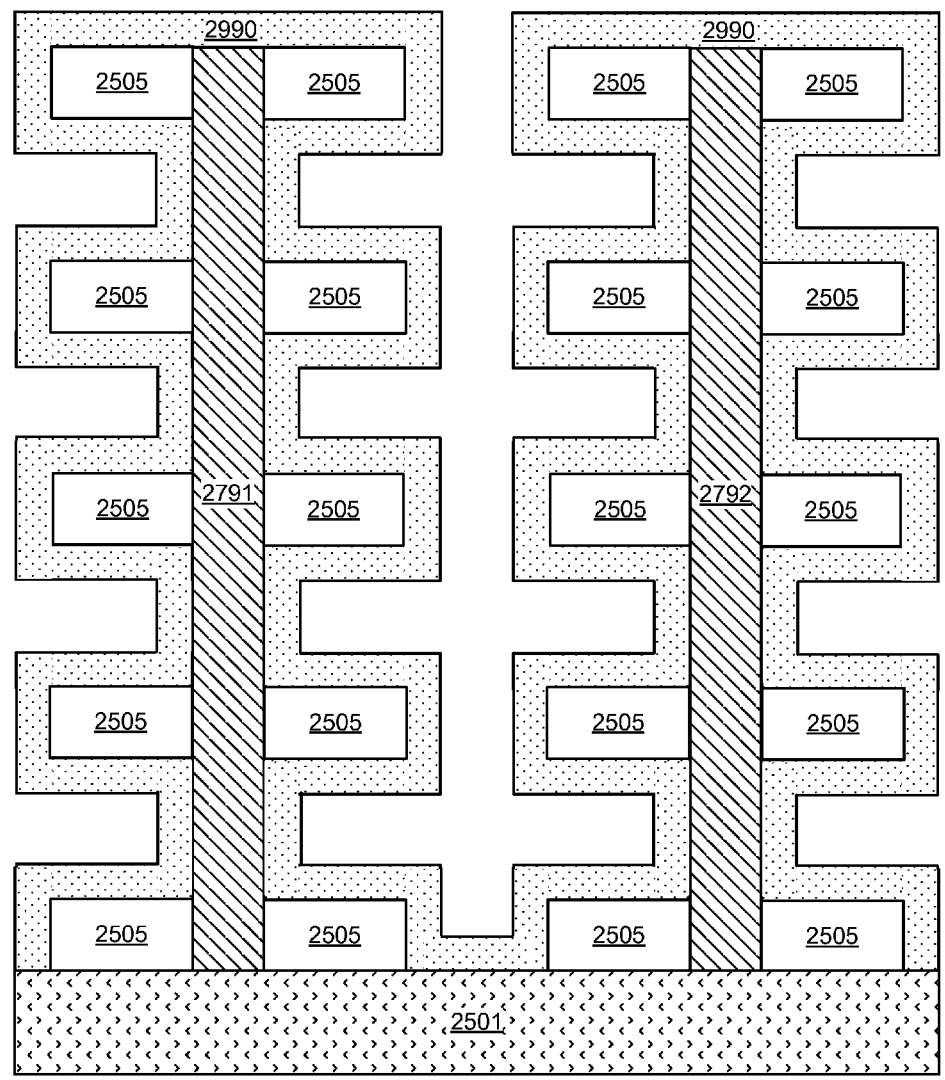

FIG. 29 illustrates a stage in the process after forming a memory layer 2990 on side surfaces of the inter-stack semiconductor body elements 2791 and 2792. The memory layer 2990 can include a multilayer dielectric charge storage structure, known from flash memory technologies, including for example flash memory technologies known as SONOS, BE-SONOS, TANOS, and MA BE-SONOS.

Figure 30:
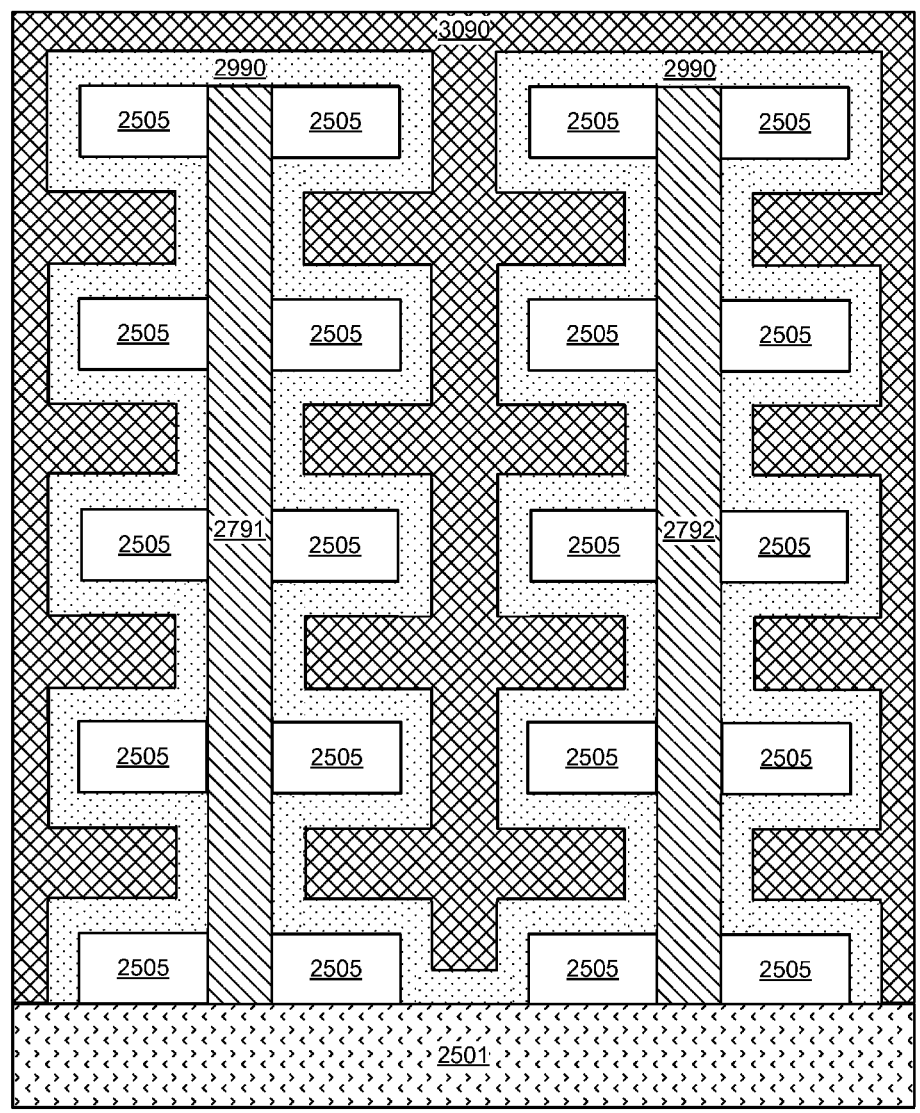

FIG. 30 illustrates a stage in the process after forming a plurality of layers of the first conductive material 3090 between and over pairs of adjacent stacks, filling the openings left by removal of the sacrificial layers between layers of insulating material 2505, and over the memory layer 2990.

Figure 31:
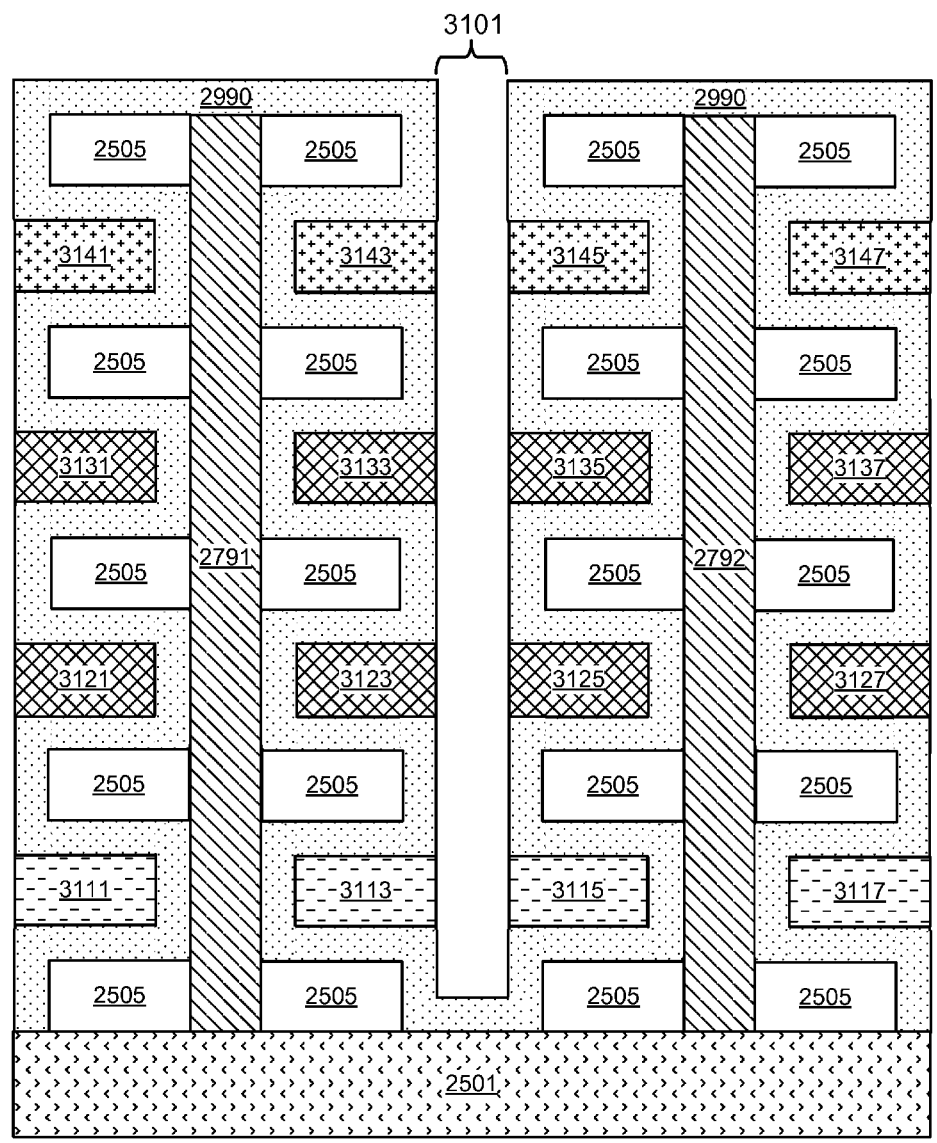

FIG. 31 illustrates a stage in the process after etching trenches (e.g. 3101) between the stacks of conductive strips, removing excess material in the layers of the first conductive material 3090 to define stacks including at least a bottom plane (GSL) of conductive strips 3111, 3113, 3115, and 3117, a plurality of intermediate planes (WLs) of conductive strips 3121, 3123, 3125, and 3127, and conductive strips 3131, 3133, 3135, and 3137, and a top plane of conductive strips (SSLs) 3141, 3143, 3145, and 3147.

Figure 32:
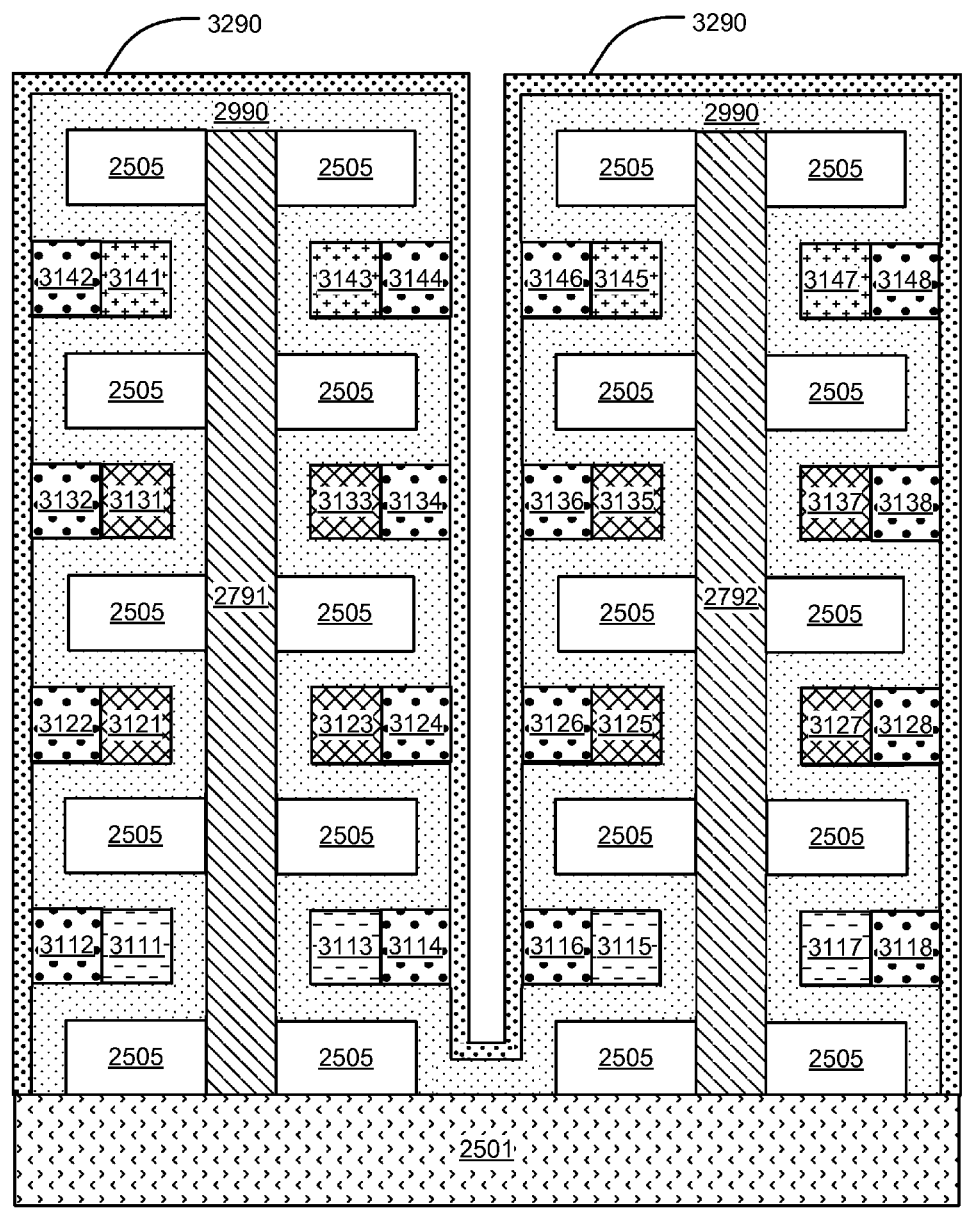

FIG. 32 illustrates a stage in the process after a process to form silicide on the sidewalls of the conductive strips 3111, 3113, 3115, and 3117, 3121, 3123, 3125, and 3127, 3131, 3133, 3135, and 3137, and 3141, 3143, 3145, and 3147, where the conductive strips comprise a silicon-containing material. The silicide process includes depositing a thin silicide precursor, such as a transition metal layer 3290, over sidewalls of the pairs of adjacent stacks. The silicide precursor is then annealed, to cause it to react with the silicon in the conductive strips 3111, 3113, 3115, and 3117, 3121, 3123, 3125, and 3127, 3131, 3133, 3135, and 3137, and 3141, 3143, 3145, and 3147, to form low-resistance sidewall silicide formations, such as sidewall silicide formations 3122, 3124, 3126, and 3128, silicide formations 3132, 3134, 3136, and 3138, and sidewall silicide formations 3142, 3144, 3146, and 3148, and sidewall silicide formations 3112, 3114, 3116, and 3118.

FIG. 33 illustrates a stage in the process after etching away any excess silicide precursor. The manufacturing process continues as described above, for example, to complete a 3D memory array, with dual-gate vertical NAND strings.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device including an array of NAND strings of memory cells, comprising:
    an integrated circuit substrate;
    a plurality of stacks of conductive strips separated by insulating material, including at least a bottom plane (GSL) of conductive strips, a plurality of intermediate planes (WLs) of conductive strips, and a top plane of conductive strips (SSLs);
    a plurality of bit line structures arranged orthogonally over, and having surfaces conformal with, the plurality of stacks, including inter-stack semiconductor body elements between the stacks, and linking elements over the stacks connecting the inter-stack semiconductor body elements;
    charge storage structures in interface regions at cross-points between side surfaces of the conductive strips in the stacks and inter-stack semiconductor body elements of the plurality of bit line structures;
    at least one reference line structure arranged orthogonally over the plurality of stacks, including inter-stack vertical conductive elements between the stacks, and linking elements over the stacks connecting the inter-stack vertical conductive elements; and
    sidewall silicide formations disposed on side surfaces of a side of at least one of the conductive strips in the stacks opposite a second side of the at least one of the conductive strips, wherein on the side surfaces of the second side the charge storage structures are formed.

2. The memory device of claim 1, further comprising:
    blocks including linking elements connecting sets of word lines in the intermediate planes (WLs), and interlayer connectors coupled to landing areas in the linking elements, wherein ends of the word lines in adjacent blocks are connected via the linking elements, and the linking elements include openings through which interlayer connecters coupled to landing areas in lower intermediate planes extend; and
    sidewall silicide formations disposed on at least one side of adjacent blocks parallel to word lines in the adjacent blocks.

3. The memory device of claim 1, further comprising:
    pairs of adjacent stacks in the plurality of stacks of conductive strips, wherein charge storage structures are disposed in interface regions at cross-points between side surfaces of a first side of word lines in the intermediate planes (WLs) and the inter-stack semiconductor body elements in the plurality of bit line structures; and
    sidewall silicide formations disposed on side surfaces of a second side of the word lines opposite the first side in the intermediate planes (WLs) of conductive strips in the pairs of adjacent stacks.

4. The memory device of claim 1, wherein a group of linking elements in the bit line structures and at least a linking element in the at least one reference line structure are arranged orthogonally over a first set of word lines in the intermediate planes (WL), and a second adjacent set of word lines in the intermediate planes (WL), and interlayer connectors for the first set are arranged on a side of the group parallel to the bit lines in the group, and interlayer connectors for the second set are arranged on the same side of the group.

5. The memory device of claim 1, wherein a group of linking elements in the bit line structures and at least a linking element in the at least one reference line structure are arranged orthogonally over a first set of word lines in the intermediate planes (WL), and a second adjacent set of word lines in the intermediate planes (WL), and interlayer connectors for the first set are arranged on a side of the group parallel to the bit lines in the group, and interlayer connectors for the second set are arranged on an opposing side of the group.

6. A memory device including an array of NAND strings of memory cells, comprising:
an integrated circuit substrate;
a plurality of stacks of conductive strips separated by insulating material, including at least a bottom plane (GSL) of conductive strips, a plurality of intermediate planes (WLs) of conductive strips, and a top plane of conductive strips (SSLs);
a reference conductor (CS) disposed in a level between the bottom plane of conductive strips and the integrated circuit substrate;
a plurality of bit line structures arranged orthogonally over, and having surfaces conformal with, the plurality of stacks, including inter-stack semiconductor body elements between the stacks connected to the reference conductor, and linking elements over the stacks connecting the inter-stack semiconductor body elements;
charge storage structures in interface regions at cross-points between side surfaces of the conductive strips in the plurality of intermediate planes in the stacks and the inter-stack semiconductor body elements of the plurality of bit line structures;
at least one reference line structure arranged orthogonally over the plurality of stacks, including inter-stack vertical conductive elements between the stacks connected to the reference conductor, and linking elements over the stacks connecting the inter-stack vertical conductive elements, the inter-stack vertical conductive elements having a higher conductivity than the inter-stack semiconductor body elements; and
string select switches at interface regions with the top plane of conductive strips, and reference select switches at interface regions with the bottom plane of conductive strips.

7. The memory device of claim 6, further comprising:
blocks including linking elements connecting sets of word lines in the intermediate planes (WLs), and interlayer connectors coupled to landing areas in the linking elements, wherein ends of the word lines in adjacent blocks are connected via the linking elements, and the linking elements include openings through which interlayer connecters coupled to landing areas in lower intermediate planes extend; and
sidewall silicide formations disposed on at least one side of adjacent blocks parallel to word lines in the adjacent blocks.

8. The memory device of claim 6, further comprising:
pairs of adjacent stacks in the plurality of stacks of conductive strips, wherein charge storage structures are disposed in interface regions at cross-points between side surfaces of a first side of word lines in the intermediate planes (WLs) and the inter-stack semiconductor body elements in the plurality of bit line structures; and
sidewall silicide formations disposed on side surfaces of a second side of the word lines opposite the first side in the intermediate planes (WLs) of conductive strips in the pairs of adjacent stacks.

9. The memory device of claim 6, including a first overlying conductive layer connected to the plurality of bit line structures, including a plurality of global bit lines coupled to sensing circuits.

10. The memory device of claim 6, including a second overlying conductive layer connected to the at least one reference line structure, coupled to a reference voltage source.

11. The memory device of claim 6, wherein the reference conductor includes N+ doped semiconductor material, and the linking elements of the at least one reference line structure include N+ doped semiconductor material.

12. The memory device of claim 6, wherein the inter-stack vertical conductive elements of the at least one reference line structure include N+ doped semiconductor material.

13. The memory device of claim 6, wherein the inter-stack vertical conductive elements in the at least one reference line structure have a larger cross-sectional area than the inter-stack semiconductor body elements in the bit line structures.

14. The memory device of claim 6, further comprising:
linking elements connecting sets of word lines in the intermediate planes (WLs); and
interlayer connectors coupled to landing areas in the linking elements, wherein the linking elements include openings through which interlayer connectors coupled to landing areas in lower intermediate planes extend.

15. The memory device of claim 14, further comprising:
linking elements connecting sets of ground selection lines in the bottom plane (GSL); and
interlayer connectors coupled to landing areas in the linking elements in the bottom plane, wherein the interlayer connectors extend through the openings in the linking elements in the intermediate planes (WLs).

16. The memory device of claim 14, wherein a group of linking elements in the bit line structures and at least a linking element in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on the same side of the group.

17. The memory device of claim 14, wherein a group of linking elements in the bit line structures and at least a linking element in the at least one reference line structure are arranged orthogonally over a first set of word lines in the intermediate planes (WL), and a second adjacent set of word lines in the intermediate planes (WL), and the interlayer connectors for the first set are arranged on a side of the group parallel to the bit lines in the group, and the interlayer connectors for the second set are arranged on an opposing side of the group.

* * * * *